United States Patent
Herschell

(10) Patent No.: US 11,719,752 B1
(45) Date of Patent: Aug. 8, 2023

(54) METHOD AND DEVICE FOR POWER-EFFICIENT DETECTION OF CRANKING VOLTAGE

(71) Applicant: Geotab Inc., Oakville (CA)

(72) Inventor: Frank Herschell, Etobicoke (CA)

(73) Assignee: Geotab Inc., Oakville (CA)

( * ) Notice: Subject to any disclaimer, the term of this patent is extended or adjusted under 35 U.S.C. 154(b) by 0 days.

(21) Appl. No.: 18/093,388

(22) Filed: Jan. 5, 2023

Related U.S. Application Data

(60) Provisional application No. 63/425,405, filed on Nov. 15, 2022.

(51) Int. Cl.
  *H02J 7/00* (2006.01)
  *G01R 31/36* (2020.01)
  *G01R 31/00* (2006.01)

(52) U.S. Cl.
  CPC ....... *G01R 31/3647* (2019.01); *G01R 31/006* (2013.01)

(58) Field of Classification Search
  None
  See application file for complete search history.

(56) References Cited

U.S. PATENT DOCUMENTS

| | | | |
|---|---|---|---|
| 10,012,201 B1 * | 7/2018 | Chen | F02N 11/0818 |
| 2010/0023207 A1 * | 1/2010 | Maeda | G07C 5/085 |
| | | | 701/33.4 |

\* cited by examiner

*Primary Examiner* — Arun C Williams
(74) *Attorney, Agent, or Firm* — Sherif A. Abdel-Kader

(57) ABSTRACT

A telematics device having a voltage drop detector and a switchable voltage monitor is provided. The voltage drop detector detects a drop in the battery voltage characteristic of cranking and notifies a controller. In response, the controller switches on the switchable voltage monitor for obtaining the battery voltage. The telematics device may be used in vehicles or other equipment powered by engines.

20 Claims, 18 Drawing Sheets

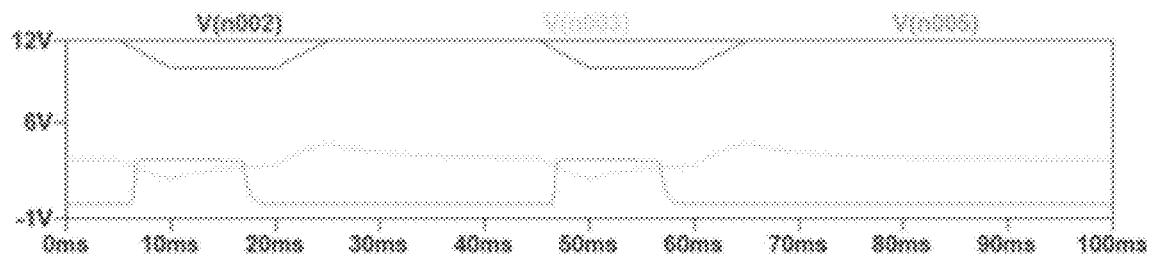
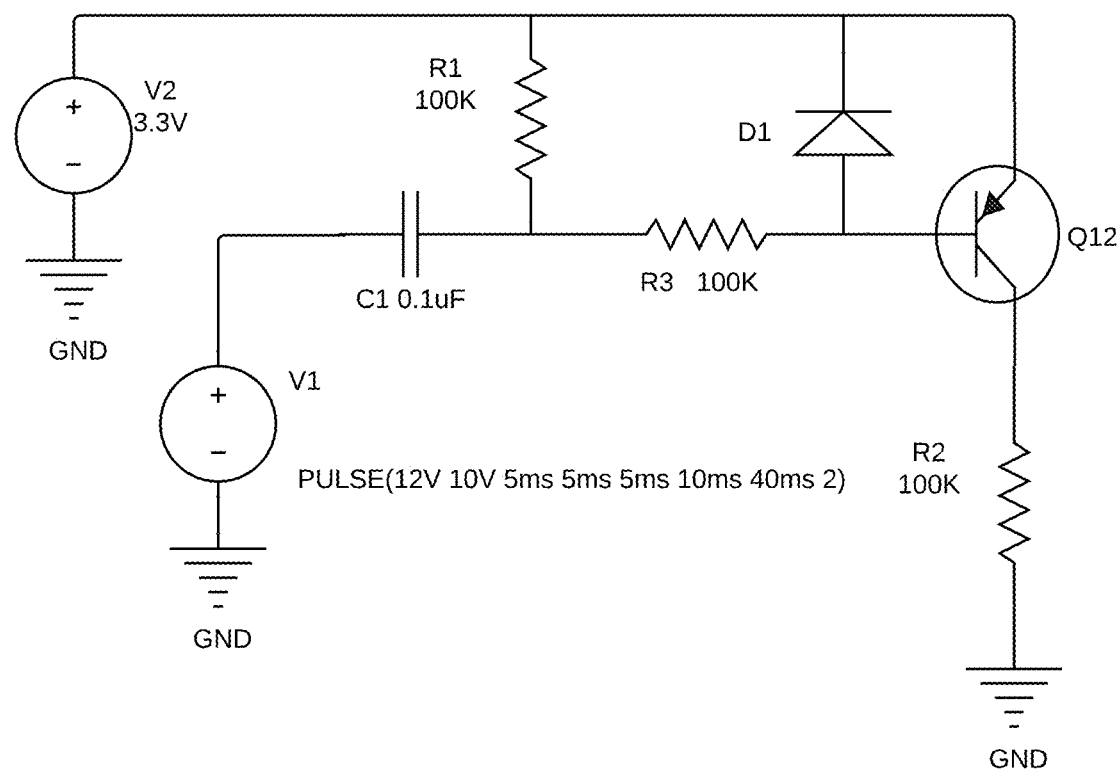
Figure 17

METHOD AND DEVICE FOR POWER-EFFICIENT DETECTION OF CRANKING VOLTAGE

FIELD

The present disclosure generally relates to machine telematics, and more specifically to a method and a device for power-efficient detection of cranking voltage.

BACKGROUND

A telematics system may gather asset data using a telematics device. The telematics device may be integrated into or located onboard the asset. The asset may be a vehicle ("vehicular asset") or some stationary equipment. The telematics device may collect the asset data from the asset through a data connection with the asset. In the case of a vehicular asset, the telematics device may gather the asset data through an onboard diagnostic port (OBD). The gathered asset data may include engine revolutions-per-minute (RPM), battery voltage, fuel level, tire pressure, oil temperature, or any other asset data available through the diagnostic port. Additionally, the telematics device may gather sensor data pertaining to the asset via sensors on the telematics device. For example, the telematics device may have temperature and pressure sensors, inertial measurement units (IMU), optical sensors, and the like. Furthermore, the telematics device may gather location data pertaining to the asset from a location module on the telematics device. When the telematics device is coupled to the asset, the gathered sensor data and location data pertain to the asset. The gathered asset data, sensor data and location data may be received and recorded by a technical infrastructure of the telematics system, such as a telematics server, and used in the provision of fleet management tools, for telematics services, or for further data analysis.

SUMMARY

A telematics device having a voltage drop detector and a switchable voltage monitor is provided. The voltage drop detector detects a drop in the battery voltage characteristic of cranking and notifies a controller. In response, the controller turns on a switchable voltage monitor to monitor the battery voltage during cranking and beyond. Advantageously, there is no drain on the vehicle's battery when the vehicle is off prior to cranking.

In one aspect of the present disclosure, there is provided a method in a telematics device coupled to a machine having an engine coupled to a starter powered by a battery of the machine. The method comprises detecting, by a voltage drop detector connected with the battery, a voltage drop in the battery voltage that is greater than a voltage drop threshold. In response to detecting the voltage drop, the method further comprises triggering, by the voltage drop detector, a cranking event on a controller of the telematics device. In response to the cranking event, the method further comprises switching on, by the controller, a switchable voltage monitor connected with the battery. Advantageously, the switchable voltage monitor is only turned on when there is a change in the battery voltage characteristic of a cranking event. Thus draining the battery by the battery voltage is avoided.

The method may further comprise converting a voltage output by the switchable voltage monitor to a digital value representing a cranking voltage of the machine.

In some embodiments, the voltage drop detector consumes no power except when the voltage drop in the battery voltage is greater than the voltage drop threshold. Advantageously, the voltage drop detector does drain the battery since it is not consuming power all the time.

In some embodiments, the switchable voltage monitor consumes no power when switched off. Advantageously, the switchable voltage monitor does not drain the battery when the vehicle is off and/or there is no cranking event.

The voltage drop threshold may be greater than or equal to a turn-on voltage of a transistor of the voltage drop detector. Advantageously, readily available components such as transistors are used to make the voltage drop detector.

Triggering the cranking event may comprise asserting a cranking event signal between the voltage drop detector and the controller.

Switching on the switchable voltage monitor may comprise asserting, by the controller, a voltage monitor enablement signal between the controller and the switchable voltage monitor.

Asserting the voltage monitor enablement signal may cause a transistor of the switchable voltage monitor to switch on thus connecting a voltage monitor of the switchable voltage monitor with the battery.

The method may further comprise transmitting the digital value representing the cranking voltage to a remote server. For example, the digital value representing the cranking voltage may be sent to a telematics server for analysis and/or storage.

Converting the voltage monitor output by the switchable voltage monitor to the digital value may comprise enabling, by the controller, a conversion at an analog-to-digital converter (ADC) coupled with the controller and connected with the voltage monitor output of the switchable voltage monitor. Advantageously, the ADC is not constantly performing a conversion of the voltage monitor output, but does so only under control of the controller and in response to a cranking event. As a result the ADC is not constantly consuming power and/or draining the battery.

The method further may comprise switching off the switchable voltage monitor in response to detecting that the machine has been turned off. Advantageously, when the machine has been turned off, the switchable voltage monitor is switched off to conserve battery power.

Switching off the switchable voltage monitor may comprise de-asserting a voltage monitor enablement signal.

De-asserting the voltage monitor enablement signal may cause a transistor of the switchable voltage monitor to turn off thus isolating a voltage monitor of the switchable voltage monitor from the battery. By isolating the voltage monitor from the battery, the voltage monitor does not drain any current from the battery.

The method may further comprise detecting, by the voltage drop detector, a rise in the battery voltage and cancelling, by the voltage drop detector, the cranking event. Advantageously, if the cranking is abandoned and the battery voltage rises, the voltage drop detector cancels the cranking event and the controller does not switch on the switchable voltage monitor thus saving battery power when there is no cranking voltage to monitor. Cancelling the cranking event may comprise de-asserting the cranking event signal.

The method may further comprise detecting that the engine is running, and keeping the switchable voltage monitor switched on in response to detecting that the engine is running. For example, if the engine starts running, the telematics device keeps the switchable voltage monitor switched on. As the engine is running, a generator such as an alternator is also running and there is no danger in draining the battery. Accordingly, keeping the switchable voltage monitor switched on ensures obtaining voltage values of the battery voltage in real-time.

The method may further comprise detecting that the engine is not running, and switching off the switchable voltage monitor in response to detecting that the engine is not running. For example, if the engine has not started after cranking is concluded, the telematics device may cause the switchable voltage monitor to be switched off so as not to drain the battery.

The method may further comprise switching off the switchable voltage monitor subsequent to converting the voltage monitor output. For example, once the ADC conversion is concluded, the controller may turn off the switchable voltage monitor. This may be the case where a single value of the cranking voltage is required.

The method may further comprise periodically switching on and switching off the switchable voltage monitor for obtaining a plurality of voltage monitor outputs. For example, the controller may periodically switch on the switchable voltage monitor, covert the voltage monitor output to a digital value, then switch off the switchable voltage monitor. In this embodiment, the telematics device samples the voltage monitor output periodically converting the sampled output voltages to digital values, but switches off the switchable voltage monitor periodically so it is not switched on all the time.

In another aspect of the present disclosure, there is provided a telematics device for coupling to a machine having an engine coupled to a starter powered by a battery of the machine. The telematics device comprises a controller, a network interface coupled to the controller, a voltage drop detector coupled to the controller and connectable with the battery, a switchable voltage monitor coupled to the controller, and connectable with the battery, and a memory coupled to the controller. The memory stores memory storing machine-executable programming instructions for execution by the controller. When the telematics device is coupled with a vehicle, the voltage drop detector is connected with the battery, the switchable voltage monitor is connected with the battery, and the voltage drop detector detects a voltage drop in a battery voltage of the battery that is greater than a voltage drop threshold. In response to detecting the voltage drop, the voltage drop detector triggers a cranking event on the controller. In response to the cranking event, the controller executes machine-executable programming instructions which switch on the switchable voltage monitor.

BRIEF DESCRIPTION OF THE DRAWINGS

Exemplary non-limiting embodiments of the present invention are described with reference to the accompanying drawings in which:

FIG. 17 depicts a SPICE simulation and corresponding circuit used for the voltage drop detector of FIG. 15.

DETAILED DESCRIPTION

Telematics System

Figure 1:
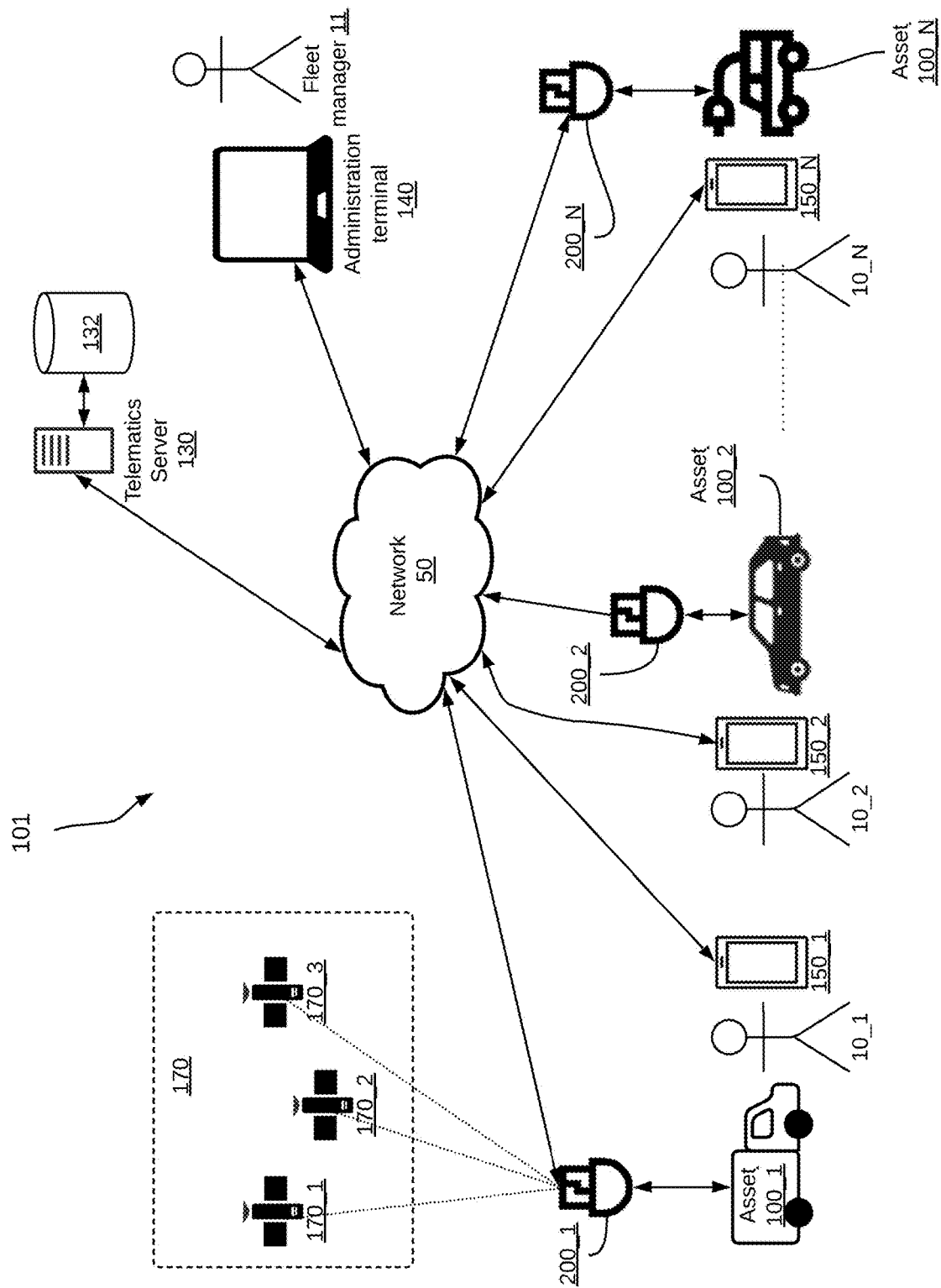
FIG. 1 is a schematic diagram of a telematics system including a plurality of telematics devices coupled to a plurality of assets.

A large telematics system may collect data from a high number of assets, either directly or through telematic devices. A telematics device may refer to a self-contained device installed at an asset, or a telematics device that is integrated into the asset itself. In either case, it may be said that telematics data is being captured or gathered by the telematics device. FIG. 1 shows a high-level block diagram of a telematics system 101. The telematics system 101 includes a telematics server 130, (N) telematics devices shown as telematics device 200_1, telematics device 200_2 . . . through telematics device 200_N ("telematics device 200"), a network 50, administration terminal 140, and operator terminals 150_1, 150_2 . . . through 150_N ("the operator terminals 150"). FIG. 1 also shows a plurality of (N) assets named as asset 100_1, asset 100_2 . . . asset 100_N ("asset 100") coupled to the telematics device 200_1, telematics device 200_2 . . . telematics device 200_N, respectively. Additionally, FIG. 1 shows a plurality of satellites 170_1, 170_2 and 170_3 ("the satellites 170") in communication with the telematics devices 200 for facilitating navigation.

The assets 100 shown are in the form of vehicles. For example, the asset 100_1 is shown as a truck, which may be part of a fleet that delivers goods or provides services. The asset 100_2 is shown as a passenger car that typically runs on an internal combustion engine (ICE). The asset 100_3 is shown as an electric vehicle (EV). Other types of vehicles, which are not shown, are also contemplated in the various embodiments of the present disclosure, including but not limited to, farming vehicles, construction vehicles, military vehicles, and the like.

The telematics devices 200 are electronic devices which are coupled to assets 100 and configured to capture asset data from the assets 100. For example, in FIG. 1 the telematics device 200_1 is coupled to the asset 100_1. Similarly, the telematics device 200_2 is coupled to the asset 100_2 and the telematics device 200_3 is coupled to the asset 100_3. The components of a telematics device 200 are explained in further detail with reference to FIG. 2.

The network 50 may be a single network or a combination of networks such as a data cellular network, the Internet, and other network technologies. The network 50 may provide connectivity between the telematics devices 200 and the telematics server 130, between the administration terminal 140 and the telematics server 130, and between the operator terminals 150 and the telematics server 130.

The telematics server 130 is an electronic device executing machine-executable programming instructions which enable the telematics server 130 to store and analyze telematics data. The telematics server 130 may be a single computer system or a cluster of computers. The telematics server 130 may be running an operating system such as Linux, Windows, Unix, or any other equivalent operating system. Alternatively, the telematics server 130 may be a software component hosted on a cloud service, such as Amazon Web Service (AWS). The telematics server 130 is connected to the network 50 and may receive telematics data from the telematics devices 200. The telematics server 130 may have a plurality of software modules for performing data analysis and analytics on the telematics data to obtain useful asset information about the assets 100. The telematics server 130 may be coupled to a telematics database 132 for storing telematics data and/or the results of the analytics which are related to the assets 100. The asset information stored may include operator information about the operators 10 corresponding to the assets. The telematics server 130 may communicate the asset data and/or the operator information pertaining to an asset 100 to one or more of: the administration terminal 140, and the operator terminal 150.

The satellites 170 may be part of a global navigation satellite system (GNSS) and may provide location information to the telematics devices 200. The location information may be processed by a location module on the telematics device 200 to provide location data indicating the location of the telematics device 200 (and hence the location of the asset 100 coupled thereto). A telematics device 200 that can periodically report an asset's location is often termed an "asset tracking device".

The administration terminal 140 is an electronic device, which may be used to connect to the telematics server 130 to retrieve data and analytics related to one or more assets 100 or to issue commands to one or more telematics device 200 via the telematics server 130. The administration terminal 140 is shown as a laptop computer, but may also be a desktop computer, a tablet (not shown), or a smartphone. The administration terminal 140 may run a web browser or a custom application which allows retrieving data and analytics, pertaining to one or more assets 100, from the telematics server 130 via a web interface of the telematics server 130. The administration terminal 140 may also be used to issue commands to one or more telematics device 200 via the telematics server 130. A fleet manager 11 may communicate with the telematics server 130 using the administration terminal 140. In addition to retrieving data and analytics, the administration terminal 140 allows the fleet manager 11 to set alerts and geofences for keeping track of the assets 100, receiving notifications of deliveries, and so on.

The operator terminals 150 are electronic devices, such as smartphones or tablets. The operator terminals 150 are used by operators 10 (for example, vehicle drivers) of the assets 100 to both track and configure the usage of the assets 100. For example, as shown in FIG. 1, the operator 10_1 has the operator terminal 150_1, the operator 10_2 has the operator terminal 150_2, and the operator 10_N has the operator terminal 150_N. Assuming the operators 10 all belong to a fleet of vehicles, each of the operators 10 may operate any of the assets 100. For example, FIG. 1 shows that the operator 10_1 is associated with the asset 100_1, the operator 10_2 is associated with the asset 100_2, and the operator 10_N is associated with the asset 100_N. However, any operator 10 may operate any asset 100 within a particular group of assets, such as a fleet. The operator terminals 150 are in communication with the telematics server 130 over the network 50. The operator terminals 150 may run at least one asset configuration application. The asset configuration application may be used by an operator 10 to inform the telematics server 130 that the asset 100 is currently being operated by the operator 10. For example, the operator 10_2 may use an asset configuration application on the operator terminal 150_2 to indicate that the operator 10_2 is currently using the asset 100_2. The telematics server 130 updates the telematics database 132 to indicate that the asset 100_2 is currently associated with the operator 10_2. Additionally, the asset configuration application may be used to report information related to the operation duration of the vehicle, the number of stops made by the operator during their working shift, and so on. Furthermore, the asset configuration application may allow the operator to configure the telematics device 200 coupled to the asset 100 that the operator 10 is operating.

In operation, a telematics device 200 is coupled to an asset 100 to capture asset data. The asset data may be combined with location data obtained by the telematics device 200 from a location module in communication with the satellites 170 and/or sensor data gathered from sensors in the telematics device 200 or another device coupled to the telematics device 200. The combined asset data, location data, and sensor data may be termed "telematics data." The telematics device 200 sends the telematics data to the telematics server 130 over the network 50. The telematics server 130 may process, aggregate, and analyze the telematics data to generate asset information pertaining to the assets 100 or to a fleet of assets. The telematics server 130 may store the telematics data and/or the generated asset information in the telematics database 132. The administration terminal 140 may connect to the telematics server 130, over the network 50, to access the generated asset information. Alternatively, the telematics server 130 may push the generated asset information to the administration terminal 140. Additionally, the operators 10, using their operator terminals 150, may indicate to the telematics server 130 which assets 100 they are associated with. The telematics server 130 updates the telematics database 132 accordingly to associate the operator 10 with the asset 100. Furthermore, the telematics server 130 may provide additional analytics related to the operators 10 including work time, location, and operating parameters. For example, for vehicle assets, the telematics data may include turning, speeding, and braking information. The telematics server 130 can correlate the telematics data to the vehicle's driver by querying the asset database 132. A fleet manager 11 may use the administration terminal 140 to set alerts for certain activities pertaining to the assets 100. When criteria for an alert is met, the telematics server 130 sends a message to the administration terminal 140 to notify a fleet manager 11, and may optionally send alerts to the operator terminal 150 to notify an operator 10 of the alert. For example, a vehicle driver operating the vehicle outside of a service area or hours of service may receive an alert on their operator terminal 150. A fleet manager 11 may also use the administration terminal 140 to configure a telematics device 200 by issuing commands thereto via the telematics server 130. Alerts may also be sent to the telematics device 200 to generate an alert to the driver such as a beep, a displayed message, or an audio message.

Telematics Device

Figure 2:
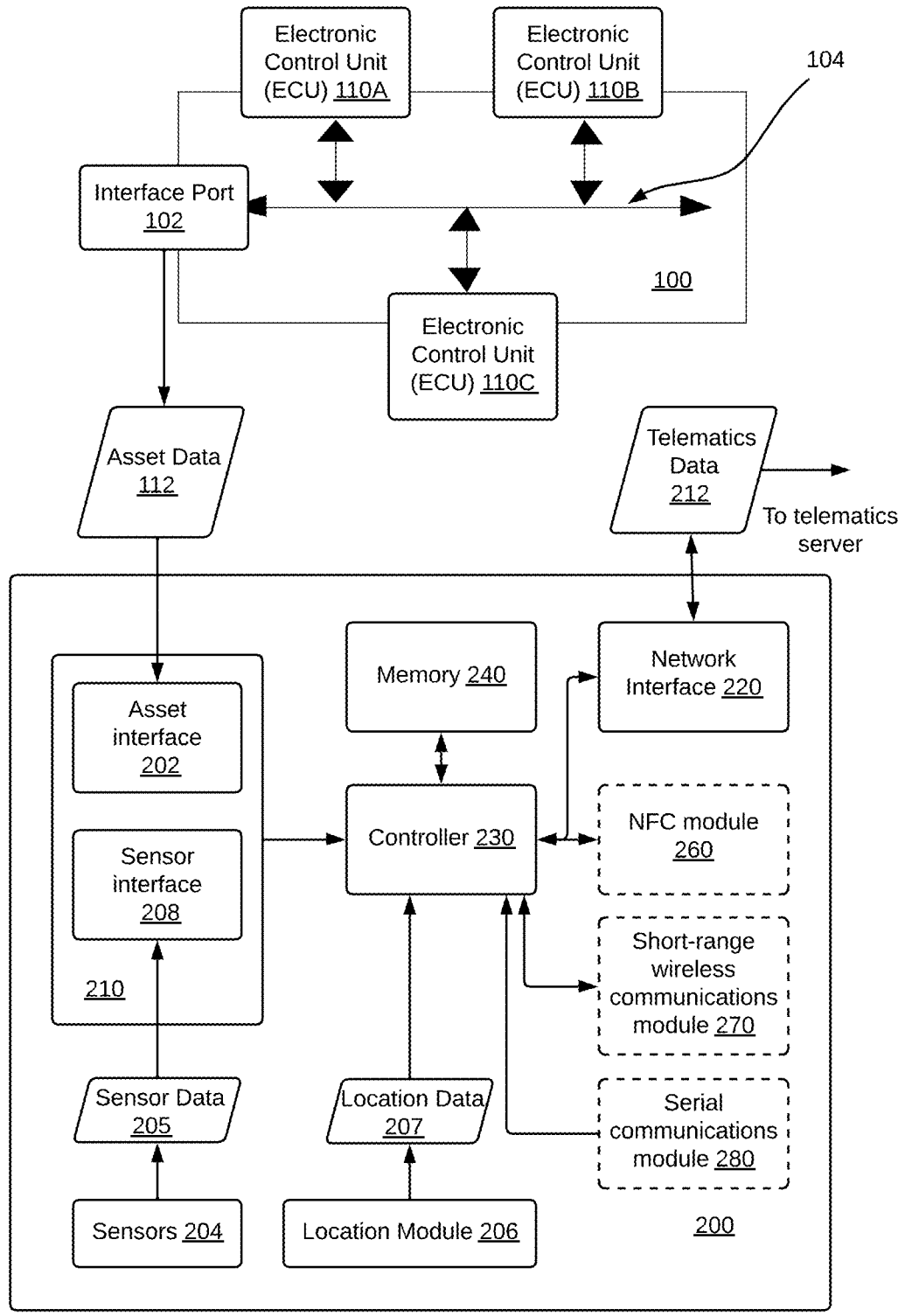
FIG. 2 is a block diagram showing a telematics device coupled to an asset.

Further details relating to the telematics device 200 and how it interfaces with an asset 100 are shown with reference to FIG. 2. FIG. 2 depicts an asset 100 and a telematics device 200 coupled thereto. Selected relevant components of each of the asset 100 and the telematics device 200 are shown.

The asset 100 may have a plurality of electronic control units (ECUs). An ECU is an electronic module which interfaces with one or more sensors for gathering information from the asset 100. For example, an engine coolant temperature (ECT) ECU may contain a temperature sensor and a controller for converting the measured temperature into digital data representative of the oil temperature. Similarly, a battery voltage ECU may contain a voltage sensor for measuring the voltage at the positive battery terminal and a controller for converting the measured voltage into digital data representative of the battery voltage. A vehicle may, for example, have around seventy ECUs. For simplicity, only a few of the ECUs 110 are depicted in FIG. 2. For example, in the depicted embodiment the asset 100 has three ECUs shown as the ECU 110A, the ECU 110B, and the ECU 110C ("the ECUs 110"). The ECU 110A, the ECU 110B, and the ECU 110C are shown to be interconnected via an asset communications bus. One example of an asset communications bus is a Controller Area Network (CAN) bus. For example, in FIG. 2 the ECUs 110 are interconnected using the CAN bus 104. The ECUs 110 send and receive information to one another in CAN data frames by placing the information on the CAN bus 104. When an ECU 110 places information on the CAN bus 104, other ECUs 110 receive the information and may or may not consume or use that information. Different protocols may be used to exchange information between the ECUs over a CAN bus. For example, ECUs 110 in trucks and heavy vehicles use the Society of Automotive Engineering (SAE) J1939 protocol to exchange information over a CAN bus 104. Most passenger vehicles use the SAE J1979 protocol, which is commonly known as On-Board Diagnostic (OBD) protocol to exchange information between ECUs 110 on their CAN bus 104. In industrial automation, ECUs use a CANOpen protocol to exchange information over a CAN bus 104. An asset 100 may allow access to information exchanged over the CAN bus 104 via an interface port 102. For example, if the asset 100 is a passenger car, then the interface port 102 is most likely an OBD-II port. Data accessible through the interface port 102 is termed the asset data 112. In some embodiments, the interface port 102 includes a power interface for providing electric power to a telematics device 200 connected thereto.

The telematics device 200 includes a controller 230 coupled to a memory 240, an interface layer 210 and a network interface 220. The telematics device 200 also includes one or more sensors 204 and a location module 206 coupled to the interface layer 210. The telematics device 200 may also contain some optional components, shown in dashed lines in FIG. 2. For example, the telematics device 200 may contain one or more of: a near-field communications (NFC) module such as NFC module 260, a short-range wireless communications module 270, and a wired communications module such as a serial communications module 280. In some embodiments (not shown), the telematics device 200 may have a dedicated power source or a battery. In other embodiments, the telematics device 200 may receive power directly from the asset 100, via the interface port 102. The telematics device 200 shown is an example. Some of the components shown in solid lines may also be optional and may be implemented in separate modules. For example, some telematics devices (not shown) may not have a location module 206 and may rely on an external location module for obtaining the location data 207. Some telematics devices may not have any sensors 204 and may rely on external sensors for obtaining sensor data 205.

The controller 230 may include one or any combination of a processor, microprocessor, microcontroller (MCU), central processing unit (CPU), processing core, state machine, logic gate array, application-specific integrated circuit (ASIC), field-programmable gate array (FPGA), or similar, capable of executing, whether by software, hardware, firmware, or a combination of such, the actions performed by the controller 230 as described herein. The controller 230 may have an internal memory for storing machine-executable programming instructions to conduct the methods described herein.

The memory 240 may include read-only-memory (ROM), random access memory (RAM), flash memory, magnetic storage, optical storage, and similar, or any combination thereof, for storing machine-executable programming instructions and data to support the functionality described herein. The memory 240 is coupled to the controller 230 thus enabling the controller 230 to execute the machine-executable programming instructions stored in the memory 240 and to access the data stored therein. The memory 240 may contain machine-executable programming instructions, which when executed by the controller 230, configures the telematics device 200 for receiving asset data 112 from the asset 100 via the asset interface 202, and for receiving sensor data 205 from the sensors 204 and/or location data 207 from the location module 206 via the sensor interface 208. The memory 240 may also contain machine-executable programming instructions for combining asset data 112, sensor data 205 and location data 207 into telematics data 212. Additionally, the memory 240 may further contain instructions which, when executed by the controller 230, configures the telematics device 200 to transmit the telematics data 212 via the network interface 220 to a telematics server 130 over a network 50. In some embodiments, the memory 240 only stores data, and the machine-executable programming instructions for conducting the aforementioned tasks are stored in an internal memory of the controller 230.

The location module 206 may be a global positioning system (GPS) transceiver or another type of location determination peripheral that may use, for example, wireless network information for location determination. The location module 206 is coupled to the controller 230 and provides location data 207 thereto. The location data 207 may be in the form of a latitude and longitude, for example.

The sensors 204 may be one or more of: a temperature sensor, a pressure sensor, an optical sensor, a motion sensor such as an accelerometer, a gyroscope, or any other suitable sensor indicating a condition pertaining to the asset 100 to which the telematics device 200 is coupled. The sensors provide sensor data 205 to the controller 230 via the sensor interface 208.

The interface layer 210 may include a sensor interface 208 and an asset interface 202. The sensor interface 208 is configured for receiving the sensor data 205 from the sensors 204. For example, the sensor interface 208 interfaces with the sensors 204 and receives the sensor data 205 therefrom. The asset interface 202 receives asset data 112 from the asset 100. In the depicted embodiment, the asset interface 202 is coupled to the interface port 102 of the asset 100. The asset data 112, received at the telematics device 200, from the asset 100 may be in the form of data messages, such as CAN data frames. The asset data 112 may describe one or more of any of: a property, a state, and an operating condition of the asset 100. For example, where the asset 100 is a vehicle, the data may describe the speed at which the vehicle is traveling, a state of the vehicle (off, idle, or running), or an engine operating condition (e.g., engine oil temperature, engine revolutions-per-minutes (RPM), or a battery voltage). In addition to receiving the asset data 112, in some embodiments the asset interface 202 may also receive power from the asset 100 via the interface port 102. The interface layer 210 is coupled to the controller 230 and provides both the asset data 112 and the sensor data 205 to the controller 230.

The network interface 220 may include a cellular modem, such as an LTE-M modem, CAT-M modem, other cellular modem, Wi-Fi modem, or any other communication device configured for communication via the network 50 with which to communicate with the telematics server 130. The network interface 220 may be used to transmit telematics data 212 obtained from the asset 100 to the telematics server 130 for a telematics service or other purposes. The network interface 220 may also be used to receive instructions from the telematics server 130 for configuring the telematics device 200 in a certain mode and/or requesting a particular type of the asset data 112 from the asset 100.

The NFC module 260 may be an NFC reader which can read information stored on an NFC tag. The NFC module 260 may be used to confirm the identity of the operator 10 by having the operator 10 tap an NFC tag onto the telematics device 200 such that the NFC tag is read by the NFC module 260. The information read from the NFC tag may be included in the telematics data 212 sent by the telematics device 200 to the telematics server 130.

The short-range wireless communications module 270 is a component intended for providing short-range wireless communication capability to the telematics device 200. The short-range wireless communications module 270 may be a Bluetooth™, wireless fidelity (Wi-Fi), Zigbee™, or any other short-range wireless communications module. The short-range wireless communications module 270 allows other devices to communicate with the telematics device 200 over a short-range wireless network.

The serial communications module 280 is an example of a wired communications module. The serial communications module 280 is an electronic peripheral for providing serial wired communications to the telematics device 200. For example, the serial communications module 280 may include a universal asynchronous receiver transmitter (UART) providing serial communications per the RS-232 protocol. Alternatively, the serial communications module 280 may be a serial peripheral interface (SPI) bus, or an inter-integrated circuit (I2C) bus. As another example, the serial communications module 280 may be a universal serial bus (USB) transceiver.

In operation, an ECU 110, such as the ECU 110A, the ECU 110B, or the ECU 110C communicates asset data over the CAN bus 104. The asset data exchanged between the ECUs 110, over the CAN bus 104 are accessible via the interface port 102 and may be retrieved as the asset data 112 by the telematics device 200. The controller 230 of the telematics device 200 receives the asset data 112 via the asset interface 202. The controller 230 may also receive sensor data 205 from the sensors 204 over the sensor interface 208. Furthermore, the controller 230 may receive location data 207 from the location module 206. The controller 230 combines the asset data 112 with the sensor data 205 and the location data 207 to obtain the telematics data 212. The controller 230 transmits the telematics data 212 to the telematics server 130 over the network 50 via the network interface 220. Optionally, an operator 10 may tap an NFC tag to the NFC module 260 to identify themself as the operator 10 of the asset 100. Additionally, an external peripheral, such as a GPS receiver, may connect with the telematics device 200 via the short-range wireless communications module 270 or the serial communications module 280 for providing location information thereto. In some embodiments, the telematics device 200 may receive, via the network interface 220, commands from the telematics server 130. The received commands instruct the telematics device 200 to be configured in a particular way. For example, the received commands may configure the way in which the telematics device gathers asset data 112 from the asset 100 as will be described in further detail below.

The telematics data 212 which is composed of asset data 112 gathered from the asset 100 combined with the sensor data 205 and the location data 207 may be used to derive useful data and analytics, by the telematics server 130. However, there are times when additional data, which is not provided by the asset 100, the sensors 204 or the location module 206 may be needed. The telematics device 200 may have a limited number of sensors 204 such as accelerometers or gyroscopes providing limited information about the motion of the asset 100 on which the telematics device 200 is deployed. The location module 206 may provide location and direction information. However, in some cases, more information may be needed to derive useful data and analytics pertaining to the asset 100. One example of information that is not typically provided by the telematics device 200 is video capture data. Another example of information that is not typically provided by the telematics device 200 is any proprietary signaling provided by devices which does not follow any of the standard protocols (OBD-II, J1939 or CANOpen). Some equipment may not have a CAN bus and may provide proprietary digital and/or analog signals. Examples of such devices include industrial equipment, winter maintenance equipment such as salt spreaders, farming equipment, and the like. Additionally, the telematics device 200 may not have an NFC module 260 or a short-range wireless communications module 270 thus limiting its connectivity capabilities.

Input/Output Expander

Figure 3:
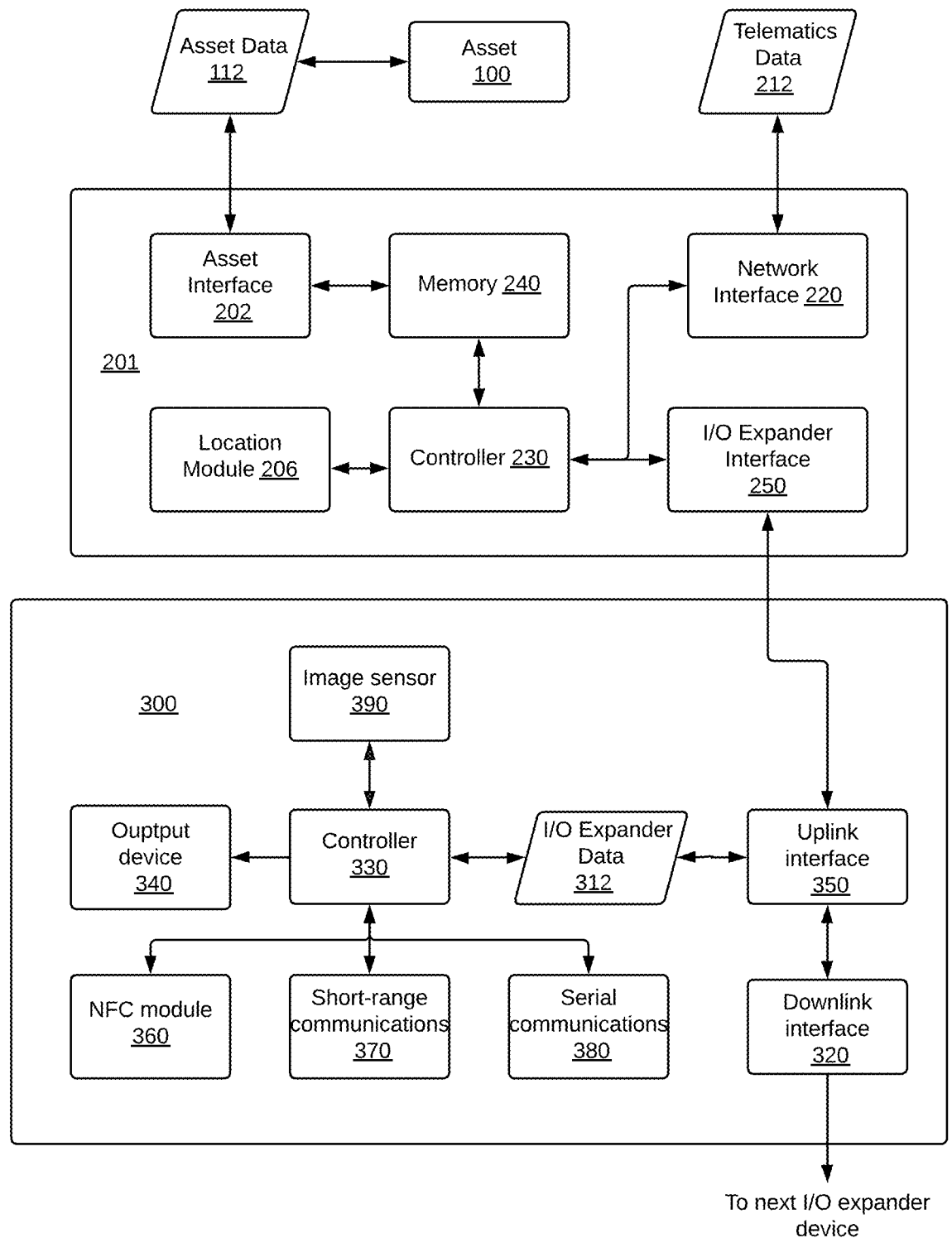
FIG. 3 is a block diagram showing a telematics device coupled to an asset and to an input/output (I/O) expander.

To capture and provide information or services not provided by the asset 100 or the telematics device, to produce an output, or to perform an action not supported by the telematics device, the telematics device 200 may be modified to allow an input/output expander device ("I/O expander") to connect thereto, as shown in FIG. 3. FIG. 3 shows a telematics device 201 coupled to an asset 100. An I/O expander 300 is coupled to the telematics device 201.

The asset 100 is similar to the asset 100 of FIG. 2 and therefore the internal components thereof are not shown in FIG. 3 for simplicity.

The telematics device 201 has a somewhat similar configuration as the telematics device 200 of FIG. 2, but some of the optional components have been removed. Furthermore, the telematics device 201 adds an I/O expander interface 250 for interfacing with the I/O expander 300. The I/O expander interface 250 is coupled to the controller 230 and may be configured for exchanging I/O expander data 312 with the I/O expander 300.

The I/O expander 300 of FIG. 3 is an example I/O expander which is designed to provide additional connectivity options to a telematics device 200, which has more limited features than the one shown in FIG. 2. For example, the telematics device 201 shown in FIG. 3 does not have an NFC module, a short-range wireless communications module, or a serial communications module. Instead, the telematics device 201 has an I/O expander interface 250.

The I/O expander 300 may be an input device configured to capture additional data such as video frames, audio frames, or proprietary signals and provide that data to the telematics device 201. Alternatively, or additionally, the I/O expander 300 may be configured as an output device and may include a display for displaying information and/or an audio output device for broadcasting messages pertaining to the asset 100.

An I/O expander 300, which connects with the telematics device 201, varies in complexity depending on the purpose thereof. FIG. 3 shows an I/O expander 300 containing several components which may or may not all be present in other I/O expanders. For example, the I/O expander 300 includes a controller 330, an NFC module 260, an output device 340, a short-range communications module 370, an image sensor 390, a serial communications module 380, an uplink interface 350 and a downlink interface 320.

The controller 330 may be similar to the controller 230 in FIG. 3. In some embodiments, the controller 330 is a microcontroller with versatile I/O capabilities. For example, the controller 330 may be a microcontroller which has a plurality of I/O ports such as general-purpose inputs and outputs (GPIOs), serial ports, analog inputs, and the like. In some embodiments, the controller 330 may have built-in persistent memory such as flash memory on which machine-executable programming instructions for conducting the functionality of the I/O expander 300 may be stored. In other embodiments, the controller 330 may be coupled to a persistent memory module (not shown) that contains the machine-executable programming instructions for conducting the functionality of the I/O expander 300. The controller 330 may also have built-in volatile memory, such as random-access memory (RAM) for storing data. Alternatively, the I/O expander 300 may be connected to an external volatile memory for storing data.

The output device 340 receives data from the controller 330 and performs an output function. For example, the output device 340 may include a display for displaying information received from the controller 330. As another example, the output device 340 may include a speech synthesizer and a speaker for displaying audible information received from the controller 330. As yet another example, the output device 340 may be an output interface to a hardware device. For example, the output device 340 may be a motor controller that interfaces to an electric motor.

The NFC module 360, short-range communications module 370, and the serial communications module 380 are similar to the NFC module 260, short-range wireless communications module 270, and the serial communications module 280 described above with reference to FIG. 2.

The image sensor 390 may be a digital still camera or a digital video camera capable of capturing images. For example, the image sensor 390 may be a road-facing dashboard camera for monitoring the road ahead. In other examples, the image sensor 390 may be a driver-facing dashboard camera for identifying the operator 10 and/or their condition.

The uplink interface 350 is an electronic peripheral interface coupled to the controller 330 and is used to provide data exchange and/or power capabilities to the I/O expander 300. The uplink interface 350 allows the I/O expander 300 to transmit and receive I/O expander data. The uplink interface 350 is configured to use the same protocol and signaling as the I/O expander interface 250 of the telematics device 201. Accordingly, the I/O expander 300 may exchange the I/O expander data with the telematics device 201. In some embodiments, the uplink interface 350 may also include power pins connected to corresponding power pins in the I/O expander interface 250, thus allowing the I/O expander 300 to be powered via the telematics device 201. In other embodiments (not shown), the I/O expander 300 may have its own power source instead of or in addition to the power provided by the telematics device 201 via the uplink interface 350.

The downlink interface 320 is an electronic peripheral interface coupled to the uplink interface 350. The downlink interface 320 is configured to interface with the uplink interface 350 of another I/O expander 300 (as will be described below). Allowing the uplink interface 350 to connect to the downlink interface 320 of another I/O expander allows the daisy chaining of I/O expanders.

Integrated Telematics Device

Figure 4:
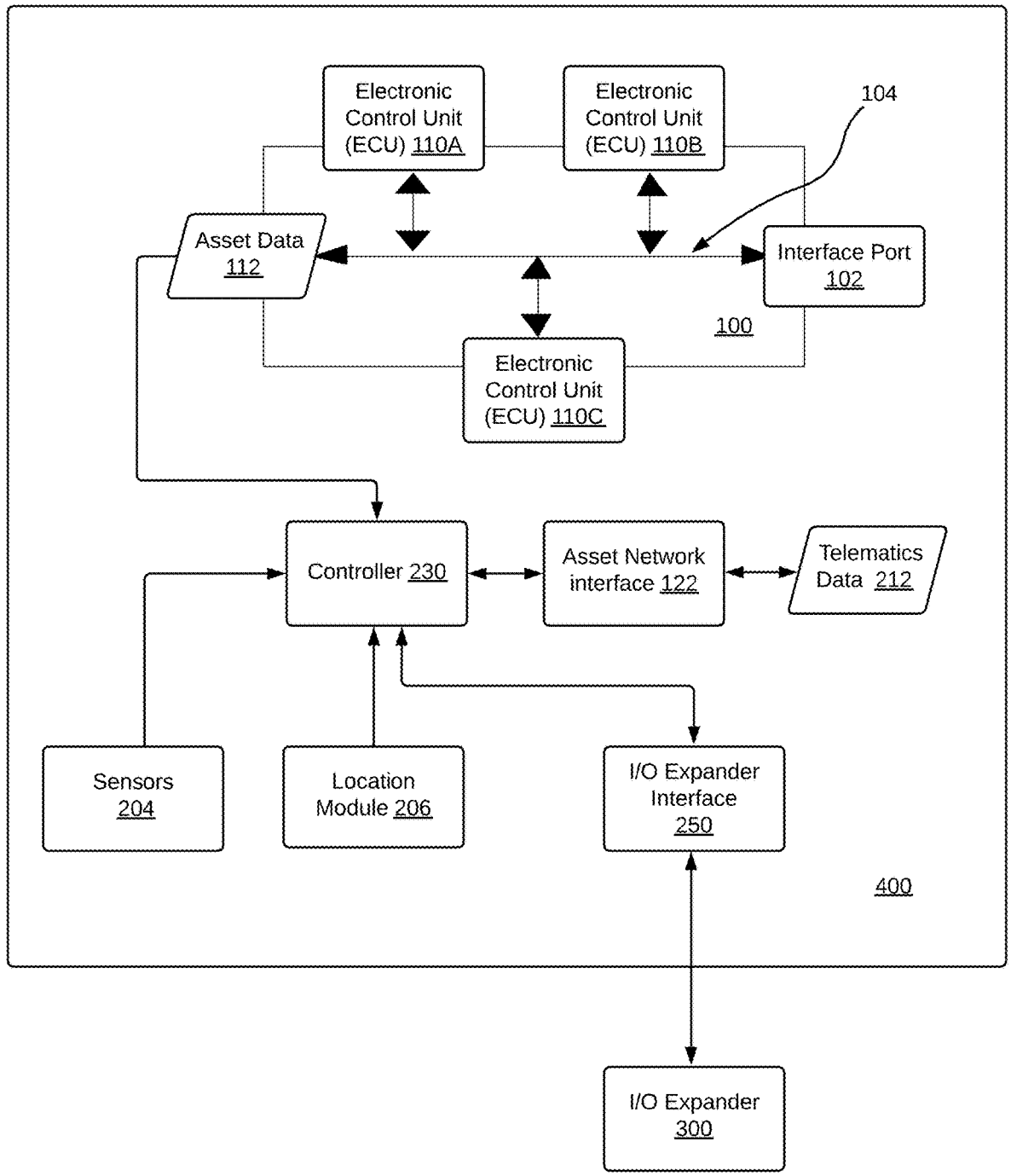
FIG. 4 is a block diagram showing an asset having a telematics device integrated therein and I/O expander coupled thereto.

In the above-mentioned figures, a telematics device is shown as a separate entity connected with a corresponding asset. The telematics device, however, may have its components integrated into the asset 100 at the time of manufacture of the asset 100. This may be the case when the asset 100 is a connected car having an asset network interface. For example, with reference to FIG. 4, there is shown an asset 400 with the components of a telematics device integrated therein, in accordance with embodiments of the present disclosure. The asset 400 is similar to the asset 100 but, being a connected asset such as a connected car, it has an asset network interface 122. In the depicted embodiment, the controller 230 is directly connected to the asset communications bus, which is a CAN bus 104 and may directly obtain the asset data 112 therefrom. The sensors 204 and the location module 206 are also integrated into the asset 100 and provide the sensor data 205 and the location data 207 to the controller 230 as described above. The asset network interface 122 belongs to the asset 400 and may be used by the asset 400 to communicate with an original equipment manufacturer (OEM) server, to a roadside assistance server, or for other purposes. The controller 230 may utilize the asset network interface 122 for the transmission of telematics data 212 provided by the controller 230. In order to support further not provided by the integrated peripherals such as the sensors 204 and the location module 206, the asset has an I/O expander interface 250 coupled to the controller 230 so that an I/O expander 300 may be connected to the asset 400 therethrough. The asset 400 may have an interface port 102 for connecting other devices other than a telematics device 200, such as a diagnostic tool including, but not limited to, an OBD-II reader device.

Capturing Asset Data

A telematics device 200 may capture asset data 112 via the interface port 102 of an asset 100 via one of two main methods. The first method is for the telematics device 200 to listen for information placed by the ECUs 110 on the asset communications bus. For example, for the CAN bus 104, the ECUs 110 may place broadcast CAN frames on the CAN bus 104 that the telematics device 200 can capture over the interface port. The second method is for the telematics device 200 to explicitly request information from an ECU 110 using a request command.

Power Consumption of a Telematics Device

A telematics device 200 deployed in an asset whether connected to an interface port 102 or integrated within the asset may be configured as an asset tracking device in that it tracks and reports the location of the asset at all times. However, a distinction is made between cases when the vehicle is on and in motion and when the vehicle is off, as will be described below.

While the vehicle is operational with the ignition turned on (or the electric motor of an EV is on), a telematics device 200 obtains and sends telematics data 212 to the telematics server 130 as described above. In order to report the location data 207 with a fine granularity (i.e., the location up to a few meters' accuracy), the location data 207 is reported to the telematics server 130 several times per second. For example, a vehicle travelling at 60 km/h moves 16 meters per second. A vehicle moving at 120 km/h moves 32 meters per second. Reporting the location data 207 along with other asset data 112 in real-time or near real-time, requires the telematics device 200 to be in a fully operational mode in which it gathers the asset data 112, the sensor data 205 and the location data 207, combines them into telematics data 212 and sends the telematics data 212 over the network interface 220. The sensors 204, the location module 206, the interface module, and the network interface 220 all have to be powered up during the fully operational mode. The telematics device 200 obtains power from a power source of the asset 100, such as the battery 60. When the asset 100 is travelling, the engine 20 is running and the alternator 30 is charging the battery 60.

When the vehicle is off (i.e., the ignition of an ICE vehicle is off or the EV is off), there is little to no asset data 112 generated by the ECUs 110. This is the case, for example, when a vehicle is parked. As such, having the telematics device 200 in a fully operational mode with all the components such as the network interface 220 powered up all the time is unnecessary. Furthermore, as the engine 20 is not running, the alternator 30 is not charging the battery 60. If the telematics device 200 is in a fully operational mode with many components powered on, the telematics device 200 may deplete the battery 60 over time as it continues to draw electric power therefrom.

One approach to reducing power consumed by the telematics device 200 when it is coupled to a vehicle asset which is not turned on is to implement a low-power scheme for the telematics device 200. In a low-power scheme (or a power-saving scheme), the telematics device 200 enters a low-power mode (also known as sleep mode) and periodically wakes up. In other words, the telematics device 200 alternates between a sleep duration and a wake-up duration. During a sleep duration, the controller 230 of the telematics device 200 is running at a slower clock speed (i.e., is in a slow-clocking mode), and most of the peripherals such as the sensors 204, location module 206, and network interface 220 are powered off. During a wake-up duration, the controller 230 exits the slow-clocking mode and the peripherals are powered on. The telematics device 200 may report the location thereof as the location data 207, which is part of the telematics data sent to the telematics server 130 during the wake-up duration. Since the vehicle is off, little to no asset data 112 is included in the telematics data 212 sent to the server. In this low-power scheme, the longer the sleep duration between two wake-up durations, the less the telematics server 130 receives updates about the location of the telematics device 200, for example. However, a short sleep duration, which translates to more frequent wake-up durations consumes more electric power. Examples of a short sleep duration range from a few minutes to an hour. Examples of a long sleep duration range from a few hours to a few days. One combined approach is to use a short sleep duration until a long sleep duration threshold is met or exceeded, and then using a long sleep duration. This approach assumes that a vehicle that is not turned on for some time may be parked for an extended period of time and accordingly, receiving a frequent update about the vehicle's location is of less importance. The combined approach to a low-power scheme is explained further with reference to FIG. 5.

Figure 5:
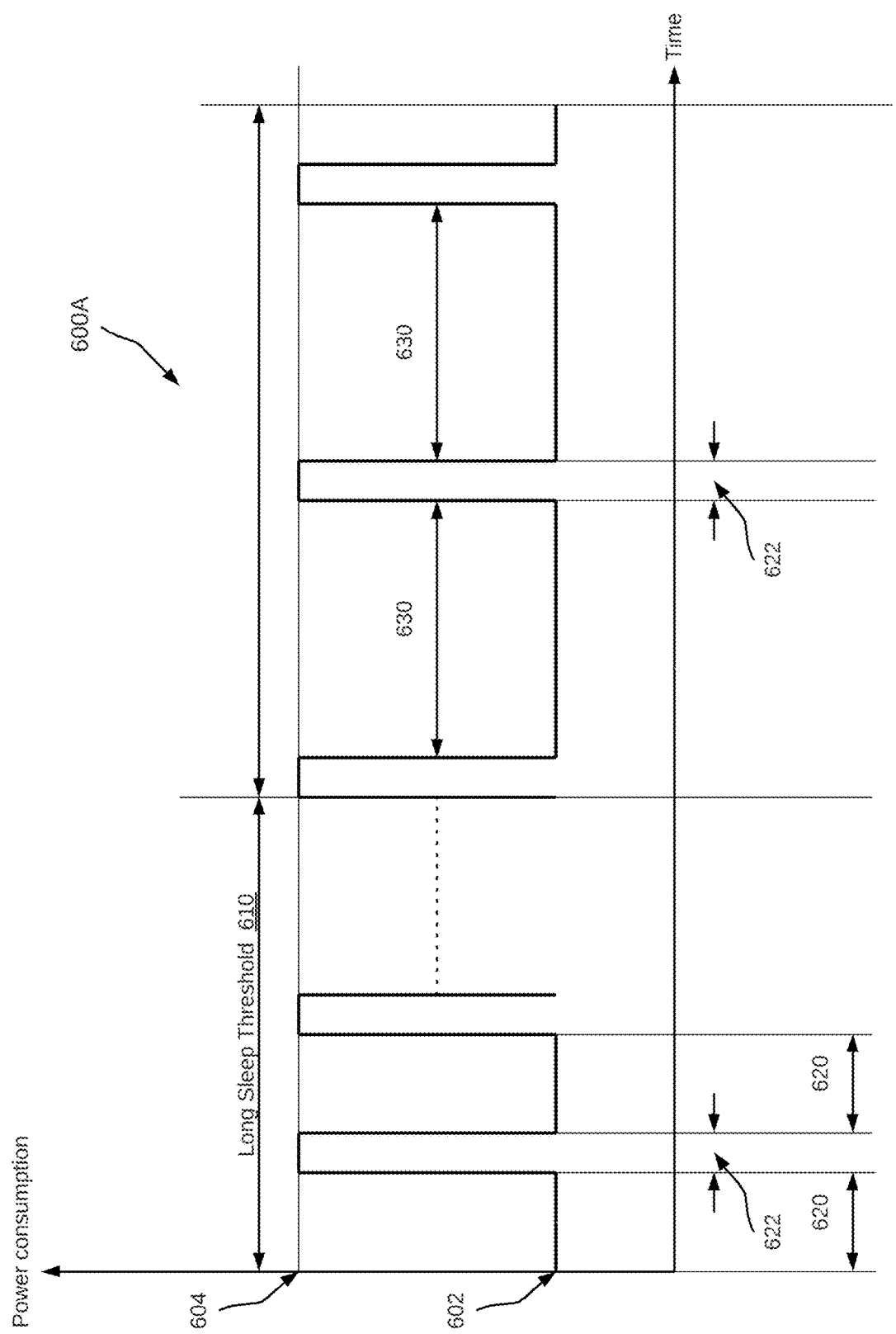
FIG. 5 is a graph showing the power consumption of the telematics device versus time during a power-saving scheme.

FIG. 5 depicts a power-saving scheme 600A for operating a telematics device 200 when the asset 100, which may be a vehicle, to which the telematics device 200 is coupled is turned off. A vehicle is off when an ignition is off for a vehicle with an internal combustion engine. For an electric vehicle (EV), a particular signal indicates whether the vehicle is on or off. In FIG. 5, the horizontal axis represents time, while the vertical axis represents the electric power consumption of the telematics device 200. At time 0, the telematics device 200 detects that the vehicle to which the telematics device 200 is coupled is off and therefore the telematics device 200 is now drawing power from the battery 60. The battery 60 may be drained if the telematics device 200 remains in fully operational mode. Accordingly, at time 0, the telematics device 200 operates in sleep mode. The power consumption of the telematics device during the sleep mode is represented by the sleep power consumption level 602. After a short sleep duration 620, the telematics device 200 exits sleep mode and is fully operational for a wake-up duration 622. During the wake-up duration 622, the telematics device 200 reports the location data 207 to the telematics server 130 via the network interface 220. During the wake-up duration, the telematics device 200 is consuming power at the full power level 604. The telematics server 130 updates the location of the telematics device 200 and updates the miles travelled by the asset 100 associated with the telematics device 200. The cycle comprising the short sleep duration 620 and the wake-up duration 622 is repeated until a time threshold since the start of the first sleep duration (i.e., time 0 in the figure) is exceeded. The time threshold may be termed the long sleep threshold 610. If the long sleep threshold 610 is exceeded, the telematics device 200 switches to a long sleep duration 630. As seen in FIG. 5, past the long sleep threshold 610, the telematics device sleeps for a long sleep duration 630 and wakes up for a wake-up duration 622. An example of the short sleep duration may include 30 minutes, while an example of a long sleep duration may be 23 hours.

In the event that the asset is turned on, the telematics device 200 upon detecting an ignition signal or an EV on signal, will stop executing the power-saving scheme 600A and will be in the fully operational mode.

The power-saving scheme 600A thus has a first stage in which the telematics device 200 alternates between lower-power (sleep) mode and powered-up (wake-up) mode. Specifically, the power-saving scheme 600A has a first stage and a second stage. In the first stage the telematics device periodically sleeps for a first sleep duration and wakes up for a wake-up (powered-up) duration. In the second stage the telematics device periodically sleeps for a second sleep duration and wakes up for the wake-up duration. The second stage of the power-saving scheme 600A is triggered after the telematics device has been in the first stage for a duration greater than a long sleep duration threshold. The second sleep duration used in the second stage is longer than the first sleep duration used in the first stage of the power-saving scheme 600A. The telematics device 200 enters the second stage when the telematics device 200 has been in the first stage for more than a long sleep threshold 610.

The power-saving scheme 600A proposed in FIG. 5 has a number of advantages. Initially, when an asset 100, such as a vehicle is turned off, the telematics device 200 provides location updates on a frequent basis, such as every 30 minutes. The power-saving scheme 600A works for a vehicle which is parked for a short-term such as overnight and is going to be driven in the morning, or parked for a few days at the airport car park, for example. During that time, the vehicle's owner, or a fleet manager 11 can verify the location of the vehicle with a relatively short frequency. If a vehicle is parked for an extended period of time, then the sleep duration is switched to a long sleep duration, which further reduces the power consumption of the telematics device 200 and reduces the possibility of draining the asset's battery, such as the battery 60. However, in some cases, sleep power consumption level 602 is still too high and may drain the vehicle battery. This may be because of some circuitry that needs to be on to capture certain events that may take place at any time. This will be explained further below.

Vehicles and Batteries

Motor vehicles are equipped with batteries for providing electric energy to power the electrical components thereof. Typical vehicle batteries are either 12V batteries or 24V batteries. In this disclosure, mainly 12V batteries will be discussed, but it would be apparent to those of skill in the art that the methods described would be equally applicable to 24V batteries, and to batteries operating at other voltages. A vehicle battery needs to be charged such that it provides a battery output voltage which is in a battery operating voltage range. The battery operating voltage range has a lower battery output voltage limit and an upper battery output voltage limit. When the vehicle battery output voltage drops below the lower battery output voltage limit, the battery is considered undercharged and needs to be charged or it will not provide sufficient electrical power to the various electrical components. In the example of a 12V battery, the lower battery output voltage limit has been found to be 12.2V. When the vehicle battery output voltage rises above the upper battery output voltage limit, the vehicle battery is considered overcharged. An overcharged battery may deteriorate quickly and the vehicle battery output voltage, which is higher than the upper battery output voltage limit, may cause damage to some of the electrical components of the vehicle. In the example of a 12V battery, the upper battery output voltage limit has been found to be 12.6V. It is therefore generally desirable to keep the battery output voltage of a 12V vehicle battery between 12.2V and 12.6V.

Cranking

Internal combustion engines need to be cranked to start their operation. Cranking an engine involves rotating the engine's crankshaft causing the pistons to move in a reciprocating manner within their corresponding cylinders. Rotating the crankshaft also causes intake valves to open letting air into the cylinders and causes an injection pump to inject fuel into the cylinders. For engines using carburetors, the intake valves let a fuel mixture of gasoline and air into the cylinders. For gasoline engines, cranking also causes the spark plugs to be activated thus igniting the fuel mixture and producing heat energy which displaces the pistons inside the cylinders. The displacement of the pistons in a reciprocating manner within the cylinders is converted to rotary motion by the crankshaft, and the engine is said to have been started. Cranking an engine is typically done by a starter motor mechanically coupled to the engine. The starter motor relies mainly on the vehicle battery to run during cranking.

Alternator

Electricity generators used in vehicles are often referred to as alternators since they generate electricity having an alternating current (AC). The generated AC is then rectified and converted to direct current (DC) to power the vehicle's electrical components and to charge the vehicle's battery. An alternator is mechanically coupled to a vehicle's internal combustion engine and converts mechanical energy provided by the engine to electrical energy. In order to charge a vehicle battery to a particular output voltage, an alternator is configured to generally produce an alternator output voltage which is higher than the battery voltage by a charging voltage offset. Accordingly, an alternator has a lower alternator output voltage limit, which is greater than a corresponding lower battery output voltage limit by the charging voltage offset. Similarly, an alternator has an upper alternator output voltage limit which is greater than a corresponding upper battery output voltage limit by the charging voltage offset. By way of example, a charging voltage offset may be 1V. For a 12V battery, the lower battery output voltage limit is 12.2V and accordingly the lower alternator output voltage limit is 13.2V for an alternator configured to charge the battery by a charging voltage offset of 1V. Similarly, for the 12V battery, the upper battery output voltage limit is 12.6V and accordingly the upper alternator output voltage limit is 13.6V for an alternator configured to charge the battery by a charging offset of 1V.

Vehicle Electric System

Figure 6:
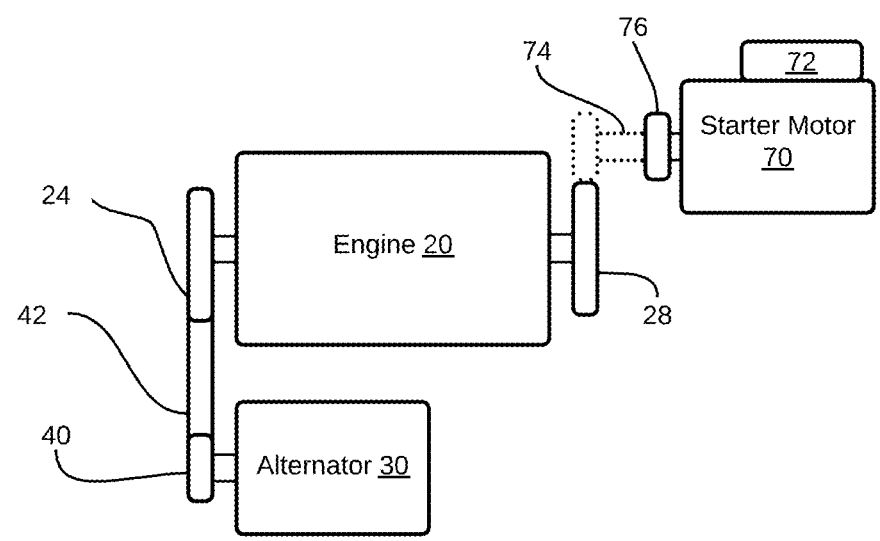
FIG. 6 is a simplified diagram depicting an internal combustion engine mechanically coupled to both an alternator and a starter motor.

An alternator is mechanically and rotationally coupled to a vehicle's engine in order to produce electricity. Similarly, a starter motor is mechanically and rotationally coupled to a vehicle's engine in order to crank the engine. With reference to FIG. 6, there is shown an engine 20 mechanically coupled to both an alternator 30 and a starter motor 70.

The engine 20 comprises a plurality of cylinders (now shown) in which a corresponding plurality of pistons are disposed and configured for reciprocating motion. The engine 20 also houses a crankshaft (not shown) mechanically coupled to the pistons. As known in the art, the reciprocating motion of the pistons are converted to rotational motion by the crankshaft. At one end of the crankshaft, there is a drive pulley 24 connected with the crankshaft and rotatable therewith. At the opposite end of the crankshaft, there is a flywheel 28 connected with the crankshaft and rotatable therewith. The flywheel 28 may be in the form of a gear and have a plurality of teeth.

An alternator 30 is disposed alongside the engine 20 and rotationally coupled thereto. The alternator 30 may be affixed to the engine block or to any part of the vehicle chassis. The alternator 30 includes an alternator pulley 40 connected to and rotatable with an alternator shaft. The alternator pulley 40 is rotationally coupled to the drive pulley 24, typically by an alternator belt 42. Accordingly, the alternator shaft rotates with the rotation of the engine crankshaft.

A starter motor 70 is disposed alongside the engine 20. The starter motor 50 has a starter motor shaft 74 which provides rotational motion when electric power is provided to the starter motor 70. A starter motor pinion gear 76 is connected to the starter motor shaft 74 and is rotatable therewith. A starter motor solenoid 72 allows extending and retracting the starter motor shaft 74. To start the engine 20, the starter motor solenoid 72 extends the starter motor shaft 74 until the starter motor pinion gear 76 engages with the flywheel 28 and rotates the engine's crankshaft. Once the engine has started, the starter motor solenoid 72 retracts the starter motor shaft 74 so that the starter motor pinion gear 76 disengages from the flywheel 28.

When the engine 20 is off and is not being cranked (started), the crankshaft is not rotating and accordingly the drive pulley 24 is not rotating. As a result, the alternator pulley 40 is also not rotating and no electric power is generated by the alternator 30. Similarly, no power is applied to the starter motor 70 and hence the starter motor pinion gear 76 does not rotate. Additionally, the starter motor shaft 74 is in retracted mode towards the starter motor 70 and the starter motor pinion gear 76 is not engaged with the flywheel 28.

When the engine 20 is cranked (started), for example by a user turning a key in an ignition or actuating a push button ignition switch, electric power is applied from the vehicle's battery to the starter motor 70 including the starter motor solenoid 72. In response to receiving electric power, the solenoid extends the starter motor shaft 74 until the teeth of the starter motor pinion gear 76 engage with the teeth of the flywheel 28, as shown in dotted lines in the figure. Additionally, the starter motor 70 rotates the starter motor shaft 74 thus rotating the starter motor pinion gear 76 therewith. Since the flywheel 28 is engaged with the starter motor pinion gear 76, the flywheel 28 rotates in the opposite direction to that of the starter motor pinion gear 76. The crankshaft rotates with the flywheel 28. As discussed above, the rotation of the crankshaft causes the engine to start. The drive pulley 24 rotates with the crankshaft. Since the alternator pulley 40 is rotationally coupled to the drive pulley 24 by the alternator belt 42, the alternator pulley 40 also rotates and the alternator 30 generates some electricity.

When the engine 20 is running, the starter motor 70 is turned off. Additionally, the starter motor solenoid 72 retracts the starter motor shaft 74 such that the starter motor pinion gear 76 is disengaged from the flywheel 28. As the engine is running, the drive pulley 24 is rotating by the action of the mechanical rotational motion produced by the engine 20. The alternator 30 rotates with the engine 20 and produces electricity to power the electrical components of the vehicle.

Figure 7:
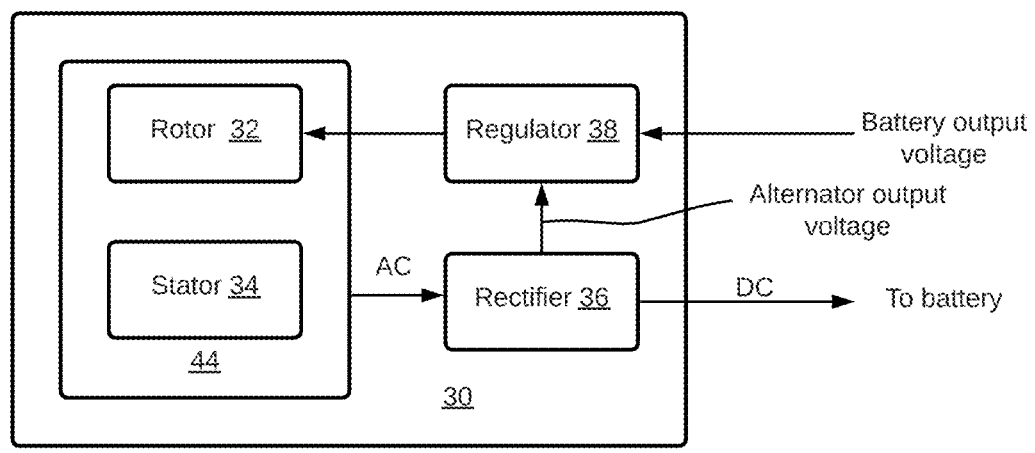
FIG. 7 is a block diagram showing the logical components of an alternator.

The structure and operation of an alternator 30 are known in the art. For illustration, FIG. 7 shows a high-level block diagram of an alternator 30 identifying its principal components. An alternator 30 includes a rotor 32, a stator 34, an alternator housing 44, a rectifier 36, and a regulator 38.

The rotor 32 is disposed on a shaft and rotatable therewith. The rotor 32 features an electromagnet (not shown) which is powered by the vehicle's battery and/or electric power generated by the alternator 30 itself. The power of the electromagnet affects the alternator output voltage. The higher the power of the electromagnet, the higher the alternator output voltage for the same rotational speed of the rotor shaft. Conversely, the lower the power of the electromagnet, the lower the alternator output voltage for the same rotational speed of the rotor shaft.

The stator 34 is circumferentially disposed inside the alternator housing 44 encompassing the rotor 32. The stator 34 is comprised of a plurality of coils typically connected in a star configuration, as known in the art. The coils have terminals at which the generated AC is provided.

The rectifier 36 converts the generated AC provided at the terminals of the coils into DC. In some example embodiments, the rectifier is comprised of a plurality of diodes, and at least one capacitor as known in the art. For a typical 3-phase alternator, there are at least 3 diodes.

The regulator 38 detects the alternator output voltage and ensures that it remains above the lower alternator output voltage limit and below the upper alternator output voltage limit. As shown the regulator 38 checks the battery output voltage and the alternator output voltage. As discussed above, the alternator output voltage is generally higher than the battery output voltage by a charging voltage offset. The regulator 38 determines the desired alternator output voltage based on the battery output voltage. If the alternator output voltage is different from the desired alternator output voltage, the regulator controls the power provided to the electromagnet of the rotor in order to maintain the alternator output voltage between the lower alternator output voltage limit and the upper alternator output voltage limit.

Rotating the alternator pulley 40 causes the rotor 32 to rotate with respect to the stator 34 and induce electricity in the stator 34. The generated electricity is in the form of an alternating current (AC) which is provided at the stator terminals (not shown). The rectifier 36 converts the generated AC to direct current (DC) output. The DC output may be provided to charge the vehicle battery, power the electromagnet of the rotor 32, and power the electrical components of the vehicle while the engine 20 is running.

The regulator 38 determines the desired alternator output voltage based on the battery operating voltage range. The regulator 38 then compares the alternator output voltage, provided thereto by the rectifier, as shown, with the desired alternator output voltage. Based on the comparison, the regulator may increase or decrease the electric power provided to the electromagnet of the rotor 32. For example, for a 12V battery, the alternator output voltage needs to be between 13.2V and 13.6V. If the alternator output voltage was at 14V, then the alternator is overcharging the battery. The regulator 38 reduces the power provided to the electromagnet of the rotor 32. As a result, the alternator output voltage is reduced. This is repeated until the alternator output voltage is at most at the upper alternator output voltage limit of 13.6V. Conversely, if the alternator output voltage is below 13.2V, the regulator 38 increases the electric power provided to the rotor 32. As a result, the alternator output voltage is increased (for the same alternator shaft rotational speed), thus increasing the alternator output voltage. This is repeated until the alternator output voltage is at least at the lower alternator output voltage limit.

Figure 8:
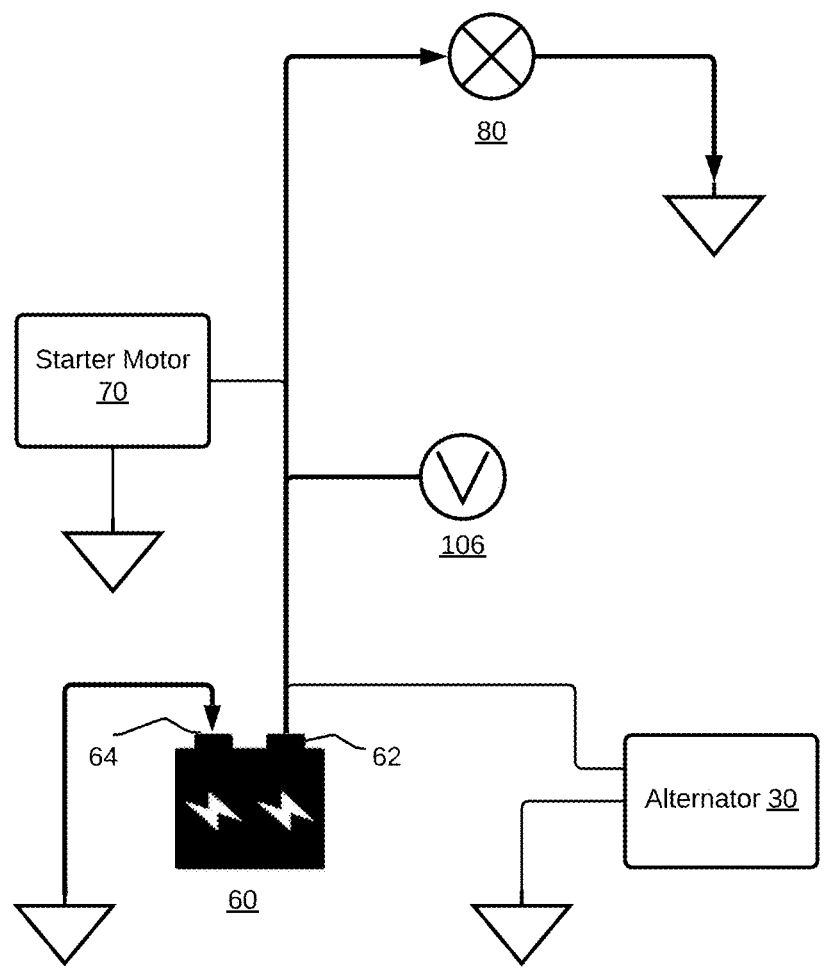
FIG. 8 is a schematic diagram showing selected components of an automotive electric system and current flow therebetween when the vehicle engine is off.
Figure 9:
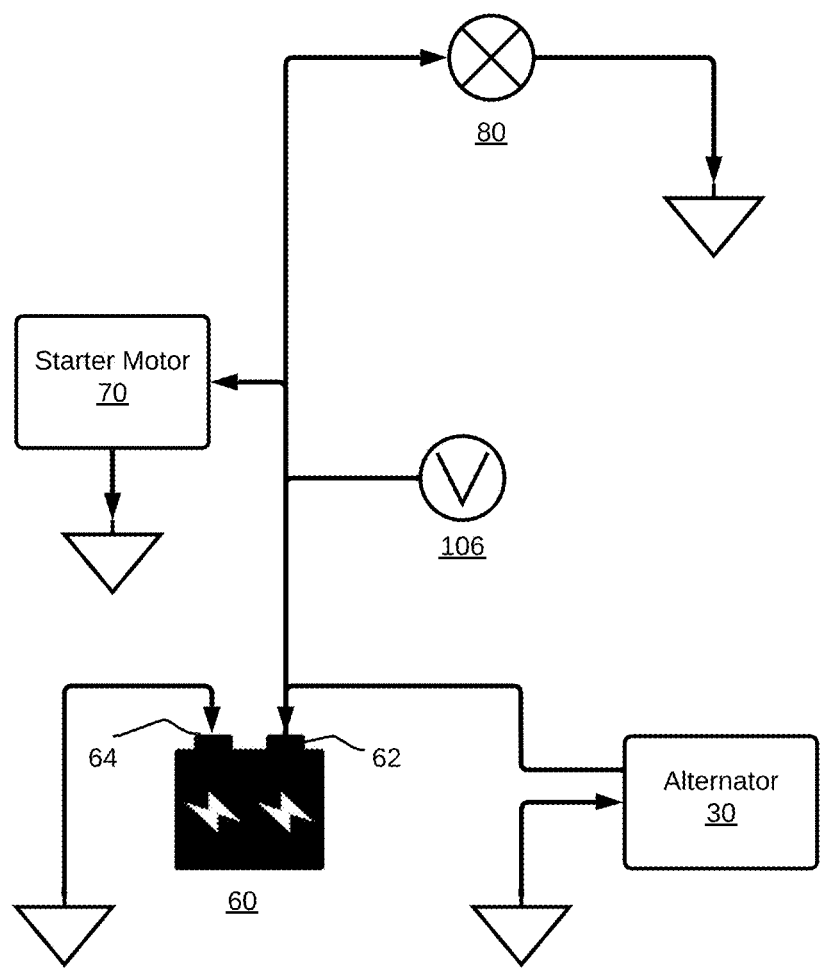
FIG. 9 is a schematic diagram of the components of FIG. 8 and current flow during a cranking event.
Figure 10:
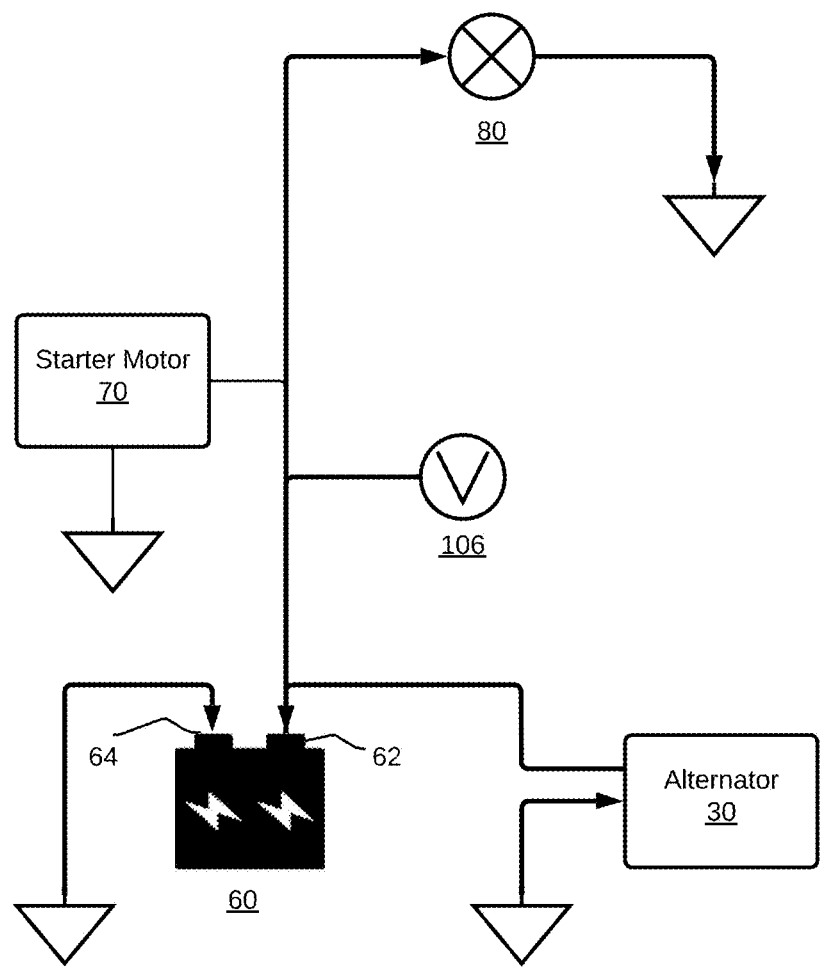
FIG. 10 is a schematic diagram of the automotive electric system of FIG. 9 during normal engine operation.

The electrical connections between the engine 20, the starter motor 70 and the alternator 30 are shown in FIGS. 8-10.

FIGS. 8-10 depict a simplified schematic of a vehicle's electric subsystems including a battery 60, a starter motor 70, an alternator 30, a voltage-sensing device 106, and an electrical component 80 shown as a light bulb. The battery 60 may be a lead acid battery or any other suitable type of battery used in vehicles. The battery 60 has a positive battery terminal 62 connected to the electrical component 80, to the starter motor 70 and to the alternator 30. The battery 60 also has a negative terminal 64 connected to the ground (i.e., the vehicle's metal chassis). The starter motor 70 is connected to the positive battery terminal 62 and to the ground. The alternator is connected to the positive battery terminal 62 and to the ground. The electrical component 80 may be any one of vehicle lights, gauges, air conditioner or entertainment system. The voltage-sensing device 106 is connected to the positive battery terminal 62 and the alternator output. The voltage measuring device may be a voltmeter, galvanometer, analog-to-digital converter (ADC), or any other suitable device that can measure voltage.

Turning first to FIG. 8. In this figure, the engine 20 is in off mode. In other words, the engine 20 is neither running nor being cranked. Accordingly, the alternator 30 is not rotating and is not producing any electric power. The only source of electricity in the vehicle is the battery 60. Thickened black lines in FIG. 8 show current flow between the battery 60 and the electrical component 80. Since the battery 60 provides electric power to the electrical component 80 and is not being charged. The voltage measured by the voltage-sensing device 106 is the voltage of the battery 60 only. In the off mode, and in the presence of an electrical component 80 which is turned on, the battery 60 is drained after some time. The time to drain the battery 60 depends on the load of the electrical component 80 and the capacity of the battery 60.

When a vehicle is started by a driver, for example by activating an ignition key, the engine 20, starter motor 70 and alternator 30 are said to be in a cranking state or undergoing a cranking event. With reference to FIG. 9, the diagram shows the same vehicle's electric subsystems of FIG. 8. FIG. 9 also shows the current flowing as solid black lines. During a cranking event, the battery 60 provides power to the starter motor 70 as indicated by the solid line between the positive battery terminal 62 and the starter motor 70. As the starter motor 70 is activated and engages the flywheel 28 as discussed above, the crankshaft of the engine rotates. As the alternator 30 is mechanically coupled to the crankshaft, the alternator shaft also rotates, and the alternator 30 starts generating some electricity. During cranking any electrical component 80 which is turned on consumes electric power from both the battery 60 and/or the alternator 30 depending on electric load of the electrical component 80. The voltage measured at the positive battery terminal 62, by the voltage-sensing device 106, during cranking is termed the "cranking voltage". The cranking voltage fluctuates as the starter motor 70 starts and as the alternator 30 starts generating electricity. As discussed below, there is a point at which the cranking voltage is at a minimum value termed the "minimum cranking voltage" and another point at which the cranking voltage is at a maximum value termed the "maximum cranking voltage".

When the engine 20 starts, the cranking event is terminated and the starter motor 70 is both disengaged from the engine 20 and is no longer powered up. This is illustrated in FIG. 10. After cranking is terminated, the voltage measured at the positive battery terminal 62, by the voltage-sensing device 106, is termed the "device voltage". As shown in FIG. 10, there are solid black lines between the alternator 30 and the positive battery terminal 62 as well as between the positive battery terminal 62 and the electrical component 80 indicating that the electrical components 80 may be consuming electric power from both the alternator 30 and the battery 60.

Battery Voltage During Cranking and Beyond

Figure 11:
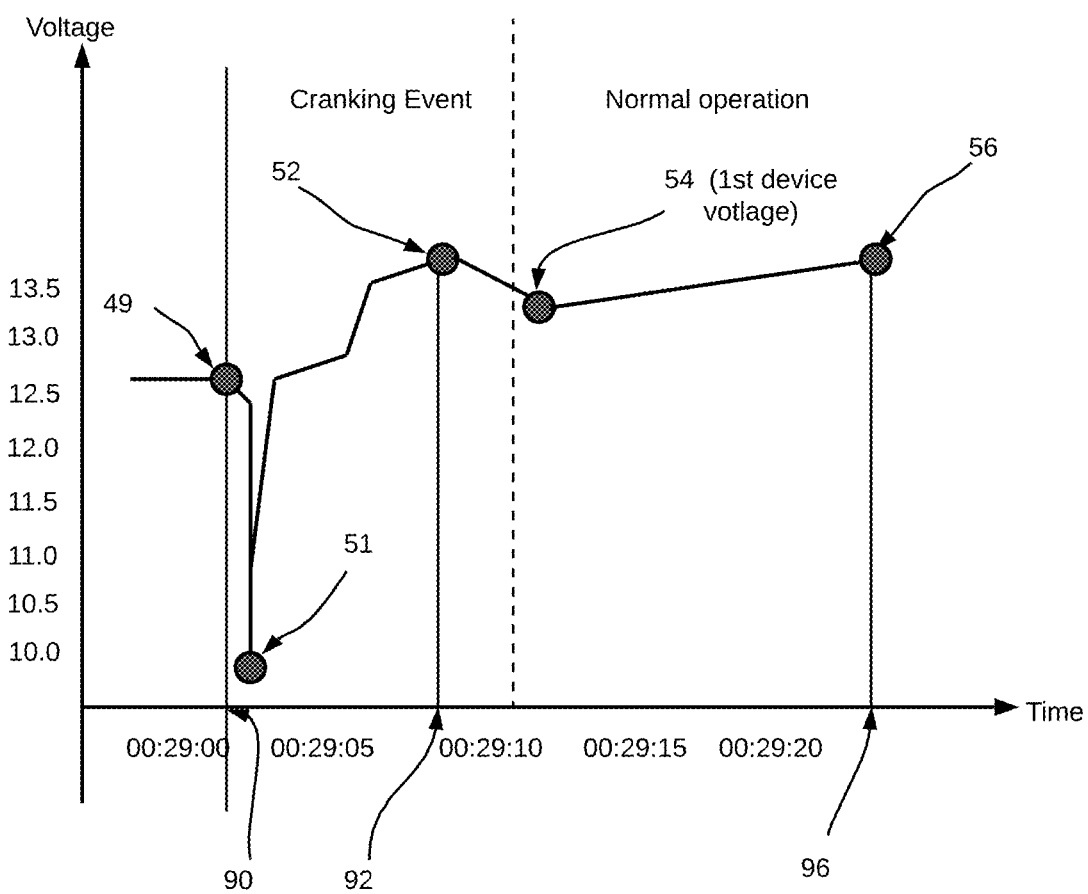
FIG. 11 is a graph depicting cranking and device voltages in an automotive electric system during and subsequent to a cranking event.

With reference to FIG. 11, there is shown a graph depicting voltage measured at the positive battery terminal (to which the output of the alternator is connected) during and after a cranking event. The horizontal axis represents time, while the vertical axis represents the voltage measured at the positive battery terminal 62. Before the cranking event, the measured voltage was around 12.6V. This represents the voltage at the positive battery terminal 62 with the alternator 30 not generating any electrical power. At time 90, the cranking event starts. The first cranking voltage 49 is unchanged and is around 12.6V. As the starter motor 70 draws a large amount of current from the vehicle battery in order to start, the battery output voltage drops significantly. As discussed, the output voltage of the battery during a cranking event is considered a cranking voltage. As can be seen, the cranking voltage drops until it is at a minimum cranking voltage 51 (which is around 9.8V approximately). As the starter motor 70 starts rotating and gains momentum, the current drawn by the starter motor 70 drops and accordingly the cranking voltage rises. Additionally, as the starter motor 70 rotates at a faster speed, so does the crankshaft of the engine, and so does the alternator shaft. As a result, the alternator 30 starts producing electricity, and the cranking voltage rises. As shown between the time 90 and the time 92.

At the time 92, the cranking voltage reaches a maximum cranking voltage 52. Once the engine has fully started, cranking is stopped, and the starter motor 70 is disengaged from the engine both electrically and mechanically. At this point, the voltage measured at the positive battery terminal 62 is the device voltage. The first device voltage 54 has the value of approximately 13.2V. At this point, the regulator 38 may increase the power provided to the electromagnet of the rotor 32 to bring the alternator output voltage to 13.6V so that it is higher by 1V than the battery output voltage, which was measured to be 12.6V before the cranking event. The device voltage reaches a maximum device voltage 56 at a time 96.

Capturing Cranking Voltage Values

Capturing the cranking voltage in real-time and recording voltage value during cranking can later give insights into the characteristics of the battery and/or the charging system. As such, the telematics device 200 needs to have a device for reading voltage at the positive battery terminal 62 during the cranking stage. In this disclosure, a device for reading voltage at the positive battery terminal 62 is termed a battery monitor.

Figure 12:
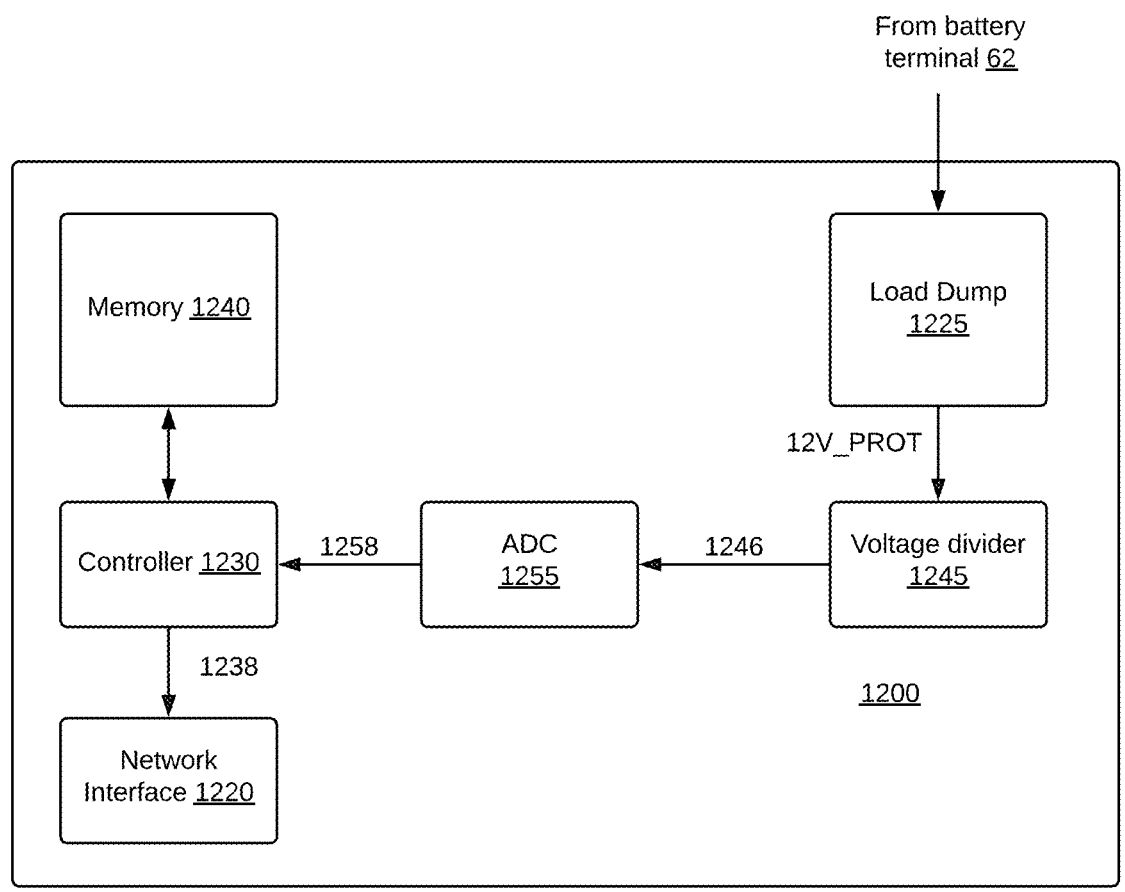
FIG. 12 is a block diagram of a telematics device including battery monitoring components.

With reference to FIG. 12, there is shown a telematics device 1200 comprising a controller 1230, a memory 1240, an analog-to-digital converter (ADC) in the form of ADC 1255, a voltage monitor 1245, and a load dump 1225.

The controller 1230 and the memory 1240 are similar to the controller 230, and the memory 240 discussed above. Similarly, the network interface 1220 is similar to the network interface 220.

The load dump 1225 provides protection against voltage/power surges at the positive battery terminal 62 thus protecting the electronic components of the telematics device 1200. A load dump is known in the art. By way of example only, the load dump 1225 may limit voltage surges coming from the battery terminal to 60V (when in some cases they may be over 100V). The output of the load dump 1225 is the power supply line 12V_PROT and is labeled as such to indicate that there is overload protection preventing voltage surges thereon. The 12V_PROT is thus a power supply line that is guaranteed to never exceed a voltage limit, such as 60V. Electronic components of the telematics device 1200 are rated higher than the voltage limit and are thus guaranteed not to be damaged even if a higher voltage surge occurs on the positive battery terminal 62. For example, the electronic components of the telematics device 1200 may be rated for 80V and are thus not damaged even if the voltage on the power supply line 12V_PROT line reaches 60V.

The voltage monitor 1245 is a device that provides an output signal representative of a voltage such as the battery voltage. In some embodiments, the voltage monitor 1245 is a passive device which is connected to the positive battery terminal 62 via the load dump 1225 and provides an output signal representative of the battery voltage. The output signal of the voltage monitor 1245 is an analog voltage on the voltage monitor output 1246. The analog voltage represents the voltage at the positive battery terminal 62, but may be scaled as will be discussed below.

Figure 13:
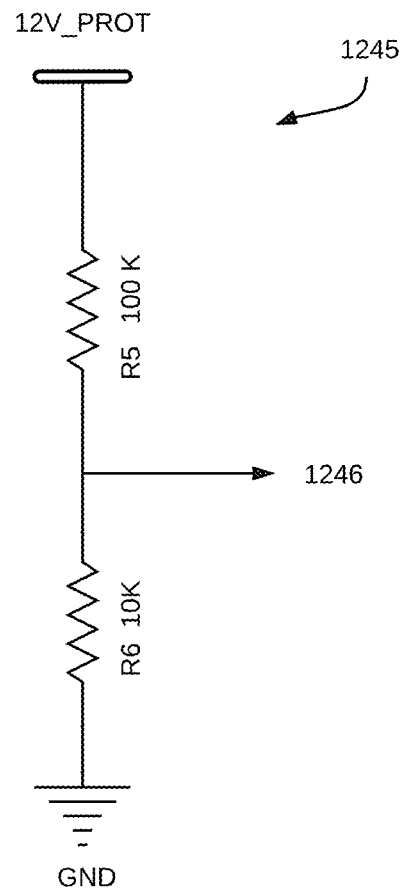
FIG. 13 is a voltage divider circuit used for monitoring battery voltage via a power supply line.

One possible implementation of the voltage monitor 1245 is shown in FIG. 13. The voltage monitor 1245 of FIG. 13 is a potential divider (a.k.a. "resistor divider" or "voltage divider") consisting of a first resistor R5 and a second resistor R6. The first resistor (R5) is disposed between the power supply line (12V_PROT) and the voltage monitor output 1246. The second resistor is disposed between the voltage monitor output 1246 and the ground (GND). In the depicted embodiment, the first resistor R5 is 100K and the second resistor R6 is 10K. The voltage measured at 1246 is determined by the formula:

$$12V\_PROT*(R5/(R5+R6))$$

Or $$12V\_PROT*(10/110)=12V\_PROT/11.$$

Accordingly, once the value of the voltage of the voltage monitor output 1246 is known, it may be scaled up (in this case by multiplying by 11) to obtain the value of the battery voltage as measured at the power supply line 12V_PROT, which represents the cranking voltage during cranking. Turning back to FIG. 12, the ADC 1255 is an analog to digital converter that converts the analog voltage of the voltage monitor output 1246 to a digital value 1258 representing the voltage monitor output 1246 that is provided to the controller 1230. In some embodiments, the ADC 1255 is an integral component of the controller 1230 even though it is shown here as a separate block for clarity.

In operation, during cranking the voltage monitor 1245 detects variations in the battery voltage at the positive battery terminal 62 of the vehicle battery, and provides a voltage monitor output 1246 to the ADC 1255. The ADC 1255 converts the analog voltage of the voltage monitor output 1246 to a digital value 1258 representative of the cranking voltage that is readable by the controller 1230. As discussed above, in some embodiments the analog voltage of the voltage monitor output 1246 has been scaled by the voltage monitor 1245, as a result of passing through a voltage divider. In such cases, the controller 1230 scales back the digital value 1258 provided by the ADC 1255 to obtain a true value of the battery voltage during cranking, i.e., a cranking voltage. The controller 1230 sends the scaled digital value 1238 of the cranking voltage to a remote server, such as the telematics server 130, over the network interface 1220.

In some embodiments, the controller 1230 repeatedly reads the digital value 1258 corresponding to the voltage monitor output 1246, scales the digital value 1258 and sends over a scaled digital value representing the battery voltage to a remote device such as the telematics server 130 over the network interface. In some embodiments, the telematics device 1200 buffers a plurality of scaled digital values and sends them together to the telematics server 130.

The telematics server 130 receives the scaled digital values representing the battery voltage and constructs a graph, such as the graph of FIG. 11 and/or identify significant events such as the minimum cranking voltage 51, the maximum cranking voltage 52 and the first device voltage 54.

Power Consumption due to Battery Voltage Monitor

Since a vehicle's engine may be started (i.e., cranked) at any time, the voltage monitor 1245 needs to be connected to the positive battery terminal 62 or to the power supply line 12V_PROT all the time. The controller 1230 also needs to sample the output of the ADC 1255 periodically to determine whether the battery voltage is undergoing any changes, such as the battery voltage variations that take place during cranking. This requires the controller 1230 to wake up periodically from sleep (or low-power) mode. The ADC 1255 also needs to be kickstarted periodically to convert the analog voltage of the voltage monitor output 1246 into a digital value 1258. Waking up the controller 1230 and causing the ADC 1255 to perform a conversion operation both consume battery power. Additionally, the voltage monitor 1245 draws current at all times. For the embodiment of FIG. 13, the voltage monitor 1245 draws 0.11 mA all the time assuming a 12V power supply line 12V_PROT and with the depicted resistance values. With reference back to FIG. 5, the voltage monitor 1245 draws that current even during sleep durations as current still flows through the voltage monitor 1245 even when the controller 1230 is in sleep mode. Consequently, the sleep power consumption level 602 of the telematics device is increased. In other words, the telematics device 200 draws electric current from the battery while the telematics device 200 is in a sleep duration as a result of having a voltage monitor 1245 that is constantly drawing current from the battery 60.

Battery Monitor Enabled by Cranking

The inventor has realized that it is wasteful to have the voltage monitor 1245 draw current at all times, particularly when a vehicle is parked for days or even weeks and the ignition is not turned on for a long time. The same applies to any machine having an engine that is not turned on and thus not undergoing any cranking. The voltage monitor 1245 is unnecessarily contributing to draining the battery. Additionally, a frequent wake-up cycle for the controller 1230, which is necessary to capture many voltage values during cranking, also drains the battery due to both the controller 1230 and the ADC 1255 consuming power, even when the battery voltage is not changing. The inventor has come up with a telematics device 200 having a switchable voltage monitor that is switched on at the outset of cranking an engine. The inventor has also come up with a voltage drop detector that detects the onset of the cranking event by detecting the voltage drop in the battery voltage that is typical of a cranking event. As a result, the cranking voltage is determined when cranking takes place but the switchable voltage monitor is otherwise drawing zero current (and thus having zero power) when switched off. The switchable voltage monitor is switched off when there are no significant changes to the battery voltage typical of cranking. Additionally, the controller 1230 and the ADC 1255 do not draw current until a cranking event has been detected, as will be described in more detail below.

Figure 14:
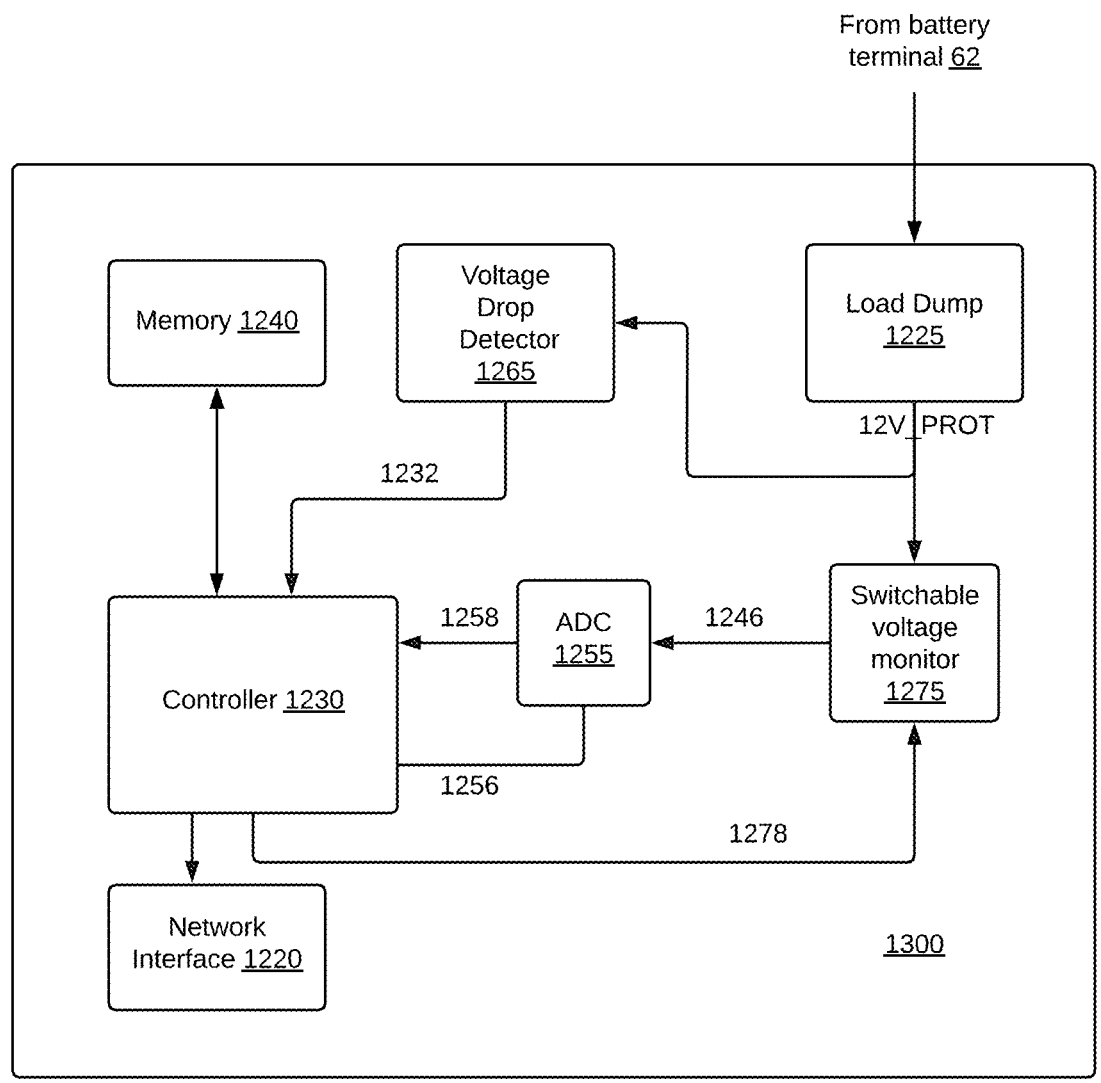
FIG. 14 is a block diagram of a telematics device including a voltage detector and a switchable voltage monitor, in accordance with embodiments of the present disclosure.

With reference to FIG. 14, there is shown a telematics device 1300 having the capability to detect cranking events and to enable a switchable voltage monitor 1275 in response to a cranking event, in accordance with embodiments of the present disclosure. The telematics device 1300 has a controller 1230, a memory 1240, a network interface 1220, a load dump 1225, a voltage drop detector 1265, an ADC 1255, and a switchable voltage monitor 1275.

The controller 1230, the memory 1240, the network interface 1220, the load dump 1225, and the ADC 1255 have all been described above with reference to FIG. 12.

The voltage drop detector 1265 is an electronic module that detects a voltage drop in the battery voltage that is greater than a voltage drop threshold that is characteristic of cranking. The voltage drop detector 1265 is connected to the power supply line 12V_PROT. When the battery voltage drops, the voltage drop is detectable on the power supply line 12V_PROT.

Upon detecting the voltage drop in the vehicle battery voltage, the voltage drop detector 1265 triggers a cranking event with the controller 1230. For example, the voltage drop detector may wake up the controller 1230 using a signal indicative of the cranking event. In some embodiments, the voltage drop detector asserts a pin or a wake-up signal line that generates an interrupt at the controller 1230. In the depicted embodiment, when the voltage on the power supply line 12V_PROT drops by a voltage drop threshold that is characteristic of cranking, the voltage drop detector asserts the cranking event signal 1232. The controller 1230 may be configured to wake up from sleep in response to cranking event signal 1232 being asserted. When the controller 1230 wakes up from sleep, the controller 1230 determines, based on the pin or signal that caused the wake-up the cause for waking up from sleep is that the battery voltage has dropped by a voltage drop that is greater than a voltage drop threshold indicative of cranking. In some embodiments, the cranking event triggers an interrupt. The controller 1230 may have multiple pins that are configured as interrupt pins and cause the controller 1230 to wake up. As is known in the art, the controller 1230 can distinguish the pin that caused the interrupt event to occur. In the depicted embodiment, the controller 1230 associates a wakeup event or a wakeup interrupt as a result of the cranking event signal 1232 being asserted with a cranking event.

The switchable voltage monitor 1275 is a switchable electronic module that monitors the voltage of the battery. For example, the switchable voltage monitor 1275 is connected with the protected output of the load dump 1225 (i.e., the protected power supply line 12V_PROT) and provides an analog voltage to the ADC 1255. What differentiates the switchable voltage monitor 1275 from the voltage monitor 1245 is that the switchable voltage monitor 1275 is switched off until it receives an enable signal on the voltage monitor enablement signal 1278. Consequently, the switchable voltage monitor 1275 is mostly off. When the switchable voltage monitor 1275 is off, the switchable voltage monitor 1275 draws little to no electric current and thus consumes little to zero power. When the switchable voltage monitor 1275 is switched on, the switchable voltage monitor 1275 is connected with the battery and provides an output voltage indicative of the battery voltage on the voltage monitor output 1246.

In operation, the voltage drop detector 1265 monitors the vehicle battery voltage. In the depicted embodiment, the voltage drop detector 1265 monitors the voltage on the 12V_PROT line. When the voltage drop detector 1265 detects a drop in the vehicle battery voltage that is above a particular voltage drop threshold, then the voltage drop detector triggers a cranking event to the controller 1230. In the depicted embodiment, the voltage drop detector 1265 asserts the cranking event signal 1232 which triggers a cranking event at the controller 1230.

In some embodiments, the cranking event signal 1232 is connected to an interrupt pin on the controller 1230. When the cranking event signal 1232 is triggered, the controller 1230 detects an interrupt event. If the controller 1230 was in sleep mode, the controller 1230 wakes up from sleep mode because of the interrupt event being triggered. The controller 1230 determines that the cause of the interrupt is a cranking event based on the identity of the pin connected to the cranking event signal 1232. In response to determining that a cranking event has taken place, the telematics device 200 switches on the switchable voltage monitor 1275. For example, the switchable voltage monitor 1275 may have an enable signal line connected to the controller 1230 thus enabling the controller 1230 to switch on and switch off the switchable voltage monitor 1275. In the depicted embodiment, the controller 1230 switches on the switchable voltage monitor 1275 by asserting the voltage monitor enablement signal 1278. Asserting the voltage monitor enablement signal 1278 switches on the switchable voltage monitor 1275. When the switchable voltage monitor 1275 is switched on, the switchable voltage monitor reads the battery voltage off of the 12V_PROT line and provides a voltage monitor output 1246 indicative of the battery voltage.

In the depicted embodiment, the controller 1230 also handles the cranking event by asserting a start conversion signal 1256 that causes the ADC 1255 to start converting the voltage at the voltage monitor output 1246 to a digital value 1258. As shown, the voltage monitor output 1246 of the switchable voltage monitor 1275 is connected to the ADC 1255. The ADC 1255 may be configured to be in idle mode until a start conversion signal thereof is asserted. In the depicted embodiment, in response to detecting a cranking event, the controller 1230 asserts the start conversion signal 1256 which causes the ADC to begin a conversion cycle of the analog voltage on the voltage monitor output 1246 into a digital value that can be read by the controller 1230.

In some embodiments, the controller 1230 periodically starts a conversion cycle on the ADC 1255 to capture different voltage values during cranking. For example, in response to detecting a cranking event, the controller 1230 may start a periodic timer. In response to the expiry of each period of the periodic timer, the controller 1230 starts a conversion cycle at the ADC 1255 by asserting the start conversion signal 1256.

In other embodiments, the controller 1230 keeps the start conversion signal 1256 asserted from the point of detecting a cranking event until the telematics device 200 detects an ignition off event. In this case, it is assumed that the ADC 1255 will begin a new conversion of the analog voltage on the voltage monitor output 1246 as soon as a previous conversion cycle has concluded.

In some embodiments, in response to detecting the cranking event, the controller 1230 periodically asserts the voltage monitor enablement signal 1278 to enable the switchable voltage monitor 1275 to output an analog voltage at the voltage monitor output 1246. The controller 1230 then asserts the start conversion signal 1256 to convert the analog voltage at the voltage monitor output 1246 to a digital value 1258. Subsequent to reading the digital value 1258 off of the ADC 1255, the controller 1230 de-asserts the voltage monitor enablement signal 1278 for a period of time to save power. In other words, the controller 1230 periodically asserts and de-asserts the voltage monitor enablement signal 1278 in order to capture discrete values of the battery voltage which may represent cranking voltage values or device voltage values.

In some embodiments, when the telematics device 200 detects that the engine of the asset 100 (i.e., the machine or vehicle) to which the telematics device 200 is coupled has been turned on and is running, then the telematics device 200 may keep the voltage monitor enablement signal 1278 asserted. As the engine is running, the alternator is generating electric power, and the switchable voltage monitor 1275 will not drain the battery even if kept on at all times. In other embodiments, the controller 1230 periodically switches on and switches off the switchable voltage monitor 1275 to obtain voltage values representing the battery voltage, as described above. Detecting that the engine is running may be determined by determining that the revolutions-per-minute (RPM) of the engine are greater than zero. The RPM is one of the vehicle parameters that may be requested by the telematics device 200 from the ECUs 110 of the engine via the interface port.

In some embodiments, when the engine of the machine or vehicle to which the telematics device 200 is connected is turned off, the telematics device 200 switches off the switchable voltage monitor 1275 until a subsequent cranking event is detected. For example, when the engine is turned off, the controller 1230 de-asserts the 1278 line thus switching off the switchable voltage monitor. Additionally, the controller 1230 also refrains from periodically starting a conversion cycle with the ADC 1255, in response to detecting that the engine has been turned off. Detecting that the engine has been turned off may comprise determining that the RPM thereof is zero.

Advantageously, the switchable voltage monitor is only enabled when the vehicle is on, the engine is running, and the alternator is charging the battery. Accordingly, the vehicle battery is not drained by any current drawn by the switchable battery monitor. Additionally, the need to periodically wake up the controller 1230 and enable the ADC 1255, even when no changes are taking place to the battery voltage (as there is no cranking) is averted further reducing the power consumption resulting from waking up the controller 1230 and from the ADC performing a conversion cycle.

Figure 15:
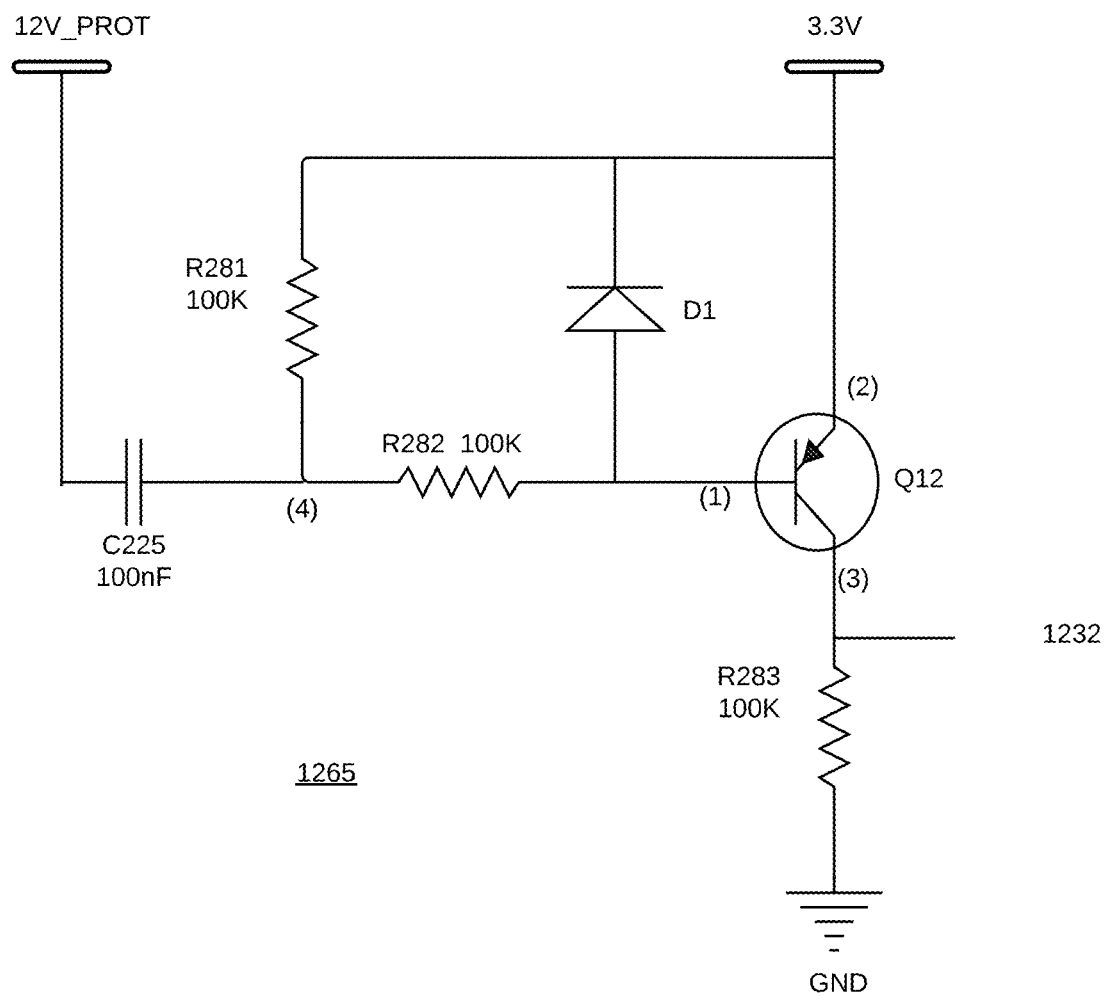
FIG. 15 is a circuit diagram depicting an implementation of a voltage drop detector, in accordance with embodiments of the present disclosure.

An exemplary implementation of the voltage drop detector used to detect cranking is provided with reference to FIG. 15. However, it would be apparent to persons skilled in the art that some variations of the exemplary implementation are also possible.

Cranking Voltage Detector

FIG. 15 is a schematic depicting an implementation of the voltage drop detector 1265, in accordance with embodiments of the present disclosure. The depicted implementation of the voltage drop detector 1265 utilizes a PNP transistor $Q_{12}$ connected at the emitter (2) side thereof to a 3.3V supply. A 100K resistor $R_{283}$ connects the collector (3) of $Q_{12}$ to the ground (GND). The output signal of the voltage drop detector 1265 is the cranking event signal 1232 discussed above and is taken between the collector (3) of $Q_{12}$ and the resistor $R_{283}$. Both the emitter (2) and the base (1) are connected to the same point each via a 100K resistor, namely the resistors $R_{281}$ and $R_{282}$. The emitter (2) and the base (1) are connected to one plate of a capacitor $C_{225}$. The opposite plate of the capacitor $C_{225}$ is connected to the power supply line 12V_PROT discussed above.

At steady state, the power supply line 12V_PROT is at 12V and the voltage at the emitter (2) of $Q_{12}$ is at 3.3V. No current is flowing through $R_{281}$. Accordingly, the voltage at the base (1) of $Q_{12}$ is also at 3.3V. Accordingly, the voltage $V_{EB}$ for $Q_{12}$ is a negative value and lower than the turn on voltage of the emitter base junction of $Q_{12}$ (which is 0.7V), then $Q_{12}$ is off. Since the transistor $Q_{12}$ is off, the cranking event signal 1232 is low as it is connected to the ground via $R_{283}$ and no current is flowing through $R_{283}$ (since $Q_{12}$ is off) and accordingly, there is no voltage drop across $R_{283}$.

As the vehicle's engine is cranked, the voltage at the power supply line 12V_PROT drops (see FIG. 11), by as much as 1V-3V, or approximately 2V down to 10V, which is the minimum cranking voltage 51. As the voltage on the power supply line 12V_PROT drops, the voltage at point (4) also drops, and in turn the voltage at the base (1) of $Q_{12}$ drops. As 12V_PROT keeps dropping, so does the voltage at the base (1) of $Q_{12}$. At some point, the voltage between the emitter (2) and the base (1) of $Q_{12}$ exceeds the turn on voltage (0.7V) at $V_{EB}$ of $Q_{12}$. In this case, the 0.7V represents a voltage threshold at and beyond which drops in the voltage on the power supply line 12V_PROT turn on the transistor $Q_{12}$. The transistor $Q_{12}$ turns on and current flows through $Q_{12}$ causing a voltage drop across $R_{283}$. Hence, the cranking event signal 1232 is asserted (becomes high), which triggers a wake up event at the controller 1230 as discussed above.

A simulation of the implementation of FIG. 15 of the voltage drop detector 1265 on the Spice™ analog electronic circuit simulator is shown in FIG. 17. In FIG. 17, the signal V(n002) represents the voltage V1 which is equivalent to the power supply line 12V_PROT. The signal V(n002) simulates the voltage drop in the 12V_PROT during cranking. As shown the signal V(n002) is dropped from 12V down to 10V over a 5 ms duration, kept at 10V for a 10 ms duration, and then ramped back up to 12V over a 5 ms duration. The signal V(n003) represents the voltage at the base of $Q_{12}$. As the voltage at the base drops below 2.6V, the voltage difference between the emitter and the base of $Q_{12}$ exceeds 0.7V and $Q_{12}$ turns on. The cranking event signal 1232 is shown as V(n005). As shown V(n005) is asserted as soon as $Q_{12}$ turns on.

Advantageously, the voltage drop detector 1265 only draws power from the battery once cranking has commenced. The switchable voltage monitor 1275 is enabled by the controller 1230 in response to a cranking event being triggered, i.e., when the cranking event signal 1232 is asserted. Since the cranking voltage may drop by 2V or even as much as 2.5V, only a small portion of the cranking (i.e., the initial 0.7V drop) takes place while the switchable voltage monitor 1275 is off. In other words, the onset of the cranking voltage drop is not captured until the battery voltage has dropped by 0.7V or more during cranking. This, however, is a minor portion of the cranking voltage profile.

An exemplary implementation of the switchable voltage monitor is described below with reference to FIG. 16. However, it would be apparent to those of skill in the art that variations in the implementation are possible.

Referring back to FIG. 11, it is noted that after the minimum cranking voltage 51, the battery voltage rises at the power supply line 12V_PROT. Accordingly, the voltage at the base (1) of the transistor $Q_{12}$ also rises until the voltage across $V_{EB}$ is less than the voltage threshold that caused $Q_{12}$ to turn on (i.e., 0.7V or the turn-on voltage of the emitter-base junction of $Q_{12}$). Accordingly, as cranking is concluded the voltage drop detector 1265 is off and not consuming any power.

Figure 16:
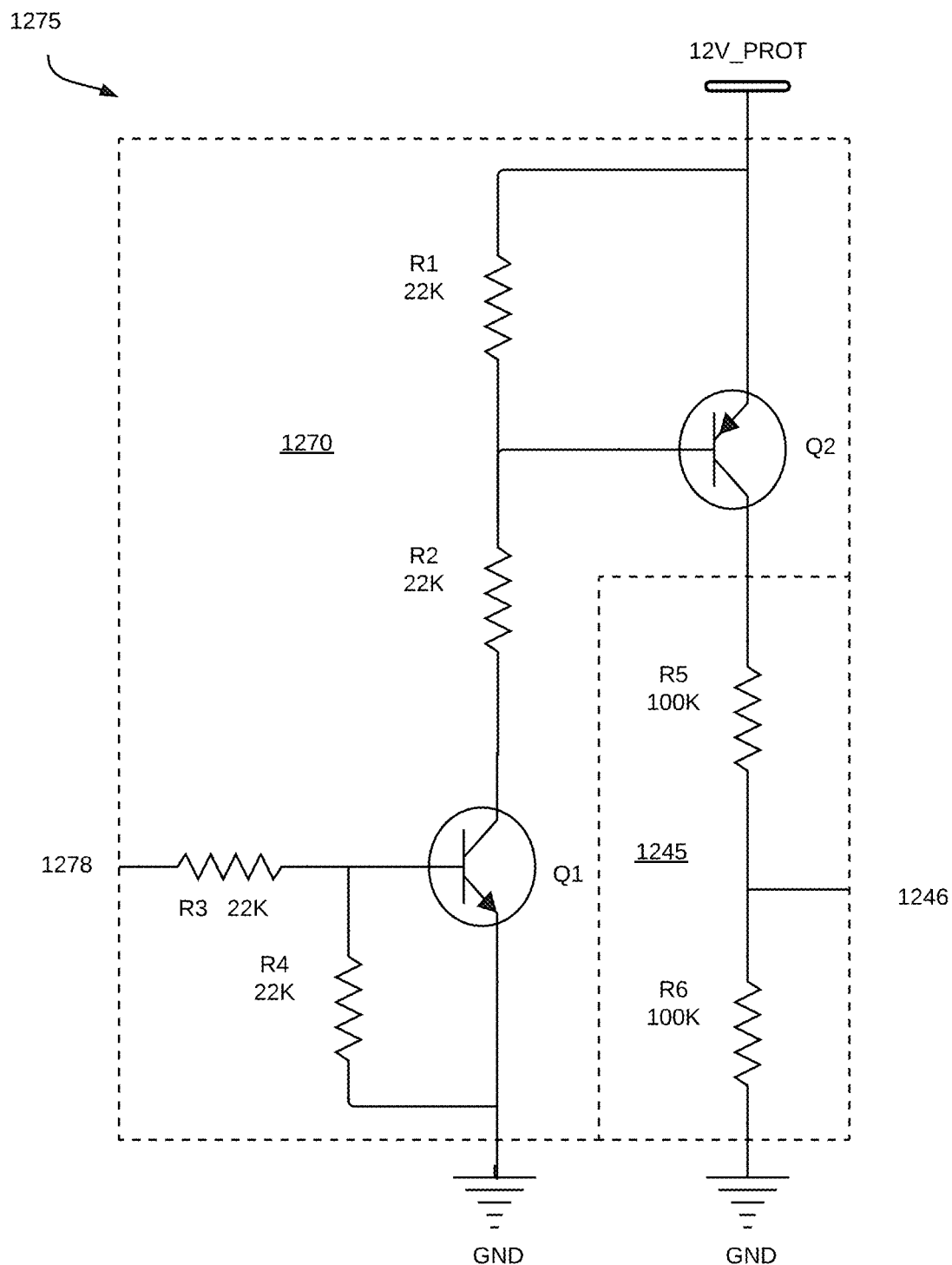
FIG. 16 is a circuit diagram depicting a switchable voltage monitor, in accordance with embodiments of the present disclosure.

FIG. 16 depicts an implementation of a switchable voltage monitor 1275, in accordance with an embodiment of the present disclosure. The switchable voltage monitor 1275 is comprised of an input-controlled switching module 1270 in the form of a resistor-equipped double transistors module and a voltage monitor 1245 in the form of the resistor divider circuit of FIG. 13. The resistor-equipped double transistors module is an integrated module that is commercially available. For example, the NHUMD3/2/12 series from Nexperia™ is a resistor-equipped double transistors module.

The input signal to the switchable voltage monitor 1275 is a voltage monitor enablement signal 1278 which is output from the controller 1230, for example via a general-purpose input/output (GPIO) pin.

The resistor-equipped double transistors module has the depicted structure. The transistor Q1 is an NPN transistor and the transistor Q2 is a PNP transistor.

As discussed above, with the ignition off in the vehicle, the controller 1230 keeps the voltage monitor enablement signal 1278 de-asserted until the controller 1230 determines that a cranking event has taken place. When the voltage monitor enablement signal 1278 is de-asserted (i.e., low), the base and emitter of the transistor Q2 are at a logic low since they are both connected to the ground. Accordingly, the transistor $Q_1$ is off because the base-emitter voltage ($V_{BE}$) thereof is 0, which is less than 0.7V. No current flows through $R_3$ or $R_4$.

When the voltage monitor enablement signal 1278 is asserted, by the controller 1230, the voltage of the voltage monitor enablement signal 1278 is at logic high (e.g. 5V or 3.3V). This causes current to flows through $R_3$ and $R_4$. If the voltage monitor enablement signal 1278 is 3.3V, there is a voltage drop of 1.65V across $R_4$ (since $R_3$ and $R_4$ are equal). Alternatively, if the voltage monitor enablement signal 1278 is 5V, the voltage drop across $R_4$ would be 2.5V. Since the voltage across $R_4$ is also the voltage between the base and emitter of $Q_1$, then $Q_1$ turns on as $V_{BE}$ thereof is greater than 0.7V (the junction turn-on voltage of the base-emitter P-N junction). When $Q_1$ turns on, current flows through $R_1$ and $R_1$. Since the power supply line 12V_PROT is at 12V, there is a voltage drop of approximately 6V across $R_1$. Accordingly, $V_{EB}$ for $Q_2$ is around 6V. Since $Q_2$ is a PNP transistor, $Q_2$ turns on when $V_{EB}$ thereof is greater than 0.7V. Consequently, $Q_2$ turns on and current flows through $R_5$ and $R_6$. The voltage monitor output 1246 is taken between $R_5$ and $R_6$ as described above. The voltage monitor output 1246 is provided to an ADC such as the ADC 1255 and converted to a digital value representative of the battery voltage during cranking and subsequent to the cranking as long as the voltage monitor enablement signal 1278 is asserted.

The switchable voltage monitor 1275 is comprised of an input-controlled switching module 1270 and a voltage monitor 1245. The input-controlled switching module 1270 enables the voltage monitor 1245 to provide a voltage monitor output 1246 when the voltage monitor enablement signal 1278 to the input-controlled switching module 1270 is asserted. Advantageously, the switchable voltage monitor 1275 draws very little to no current when the voltage monitor enablement signal 1278 of the input-controlled switching module 1270 is de-asserted since the NPN transistor $Q_2$ is off thus isolating the voltage monitor 1245 from the power supply line 12V_PROT.

The combination of the voltage drop detector 1265 and the switchable voltage monitor 1275 ensure accurate capture of the cranking voltage with little to no power consumption. The voltage drop detector 1265 avoids the need for the controller 1230 to periodically wake up and enable the ADC 1255 to read the battery voltage, when the ignition of the vehicle is off, in order to capture potential cranking voltage values. Keeping the controller 1230 in sleep mode for longer periods and keeping the ADC 1255 in low-power mode both reduce the power consumption of the telematics device 200 and reduce the possibility of draining the vehicle battery.

Additionally, the voltage drop detector 1265 allows the use of a switchable voltage monitor 1275 that is enabled via an input signal, such as the voltage monitor enablement signal 1278. Since the voltage drop detector 1265 can provide a cranking event signal to the controller 1230, the controller 1230 can enable the switchable voltage monitor 1275 to capture cranking voltages in response to detecting the cranking event. Advantageously, the switchable voltage monitor 1275 only consumes power when detecting a voltage during cranking and thereafter when ignition is on. When ignition is off, the switchable voltage monitor 1275 consumes little to no current unless a cranking event is detected. Thus a telematics device 200 coupled to a vehicle and employing the voltage drop detector 1265 and a switchable voltage monitor 1275 as described is capable of providing accurate detection of a cranking event and accurate capture of cranking voltages, without draining the vehicle battery.

Figure 18:
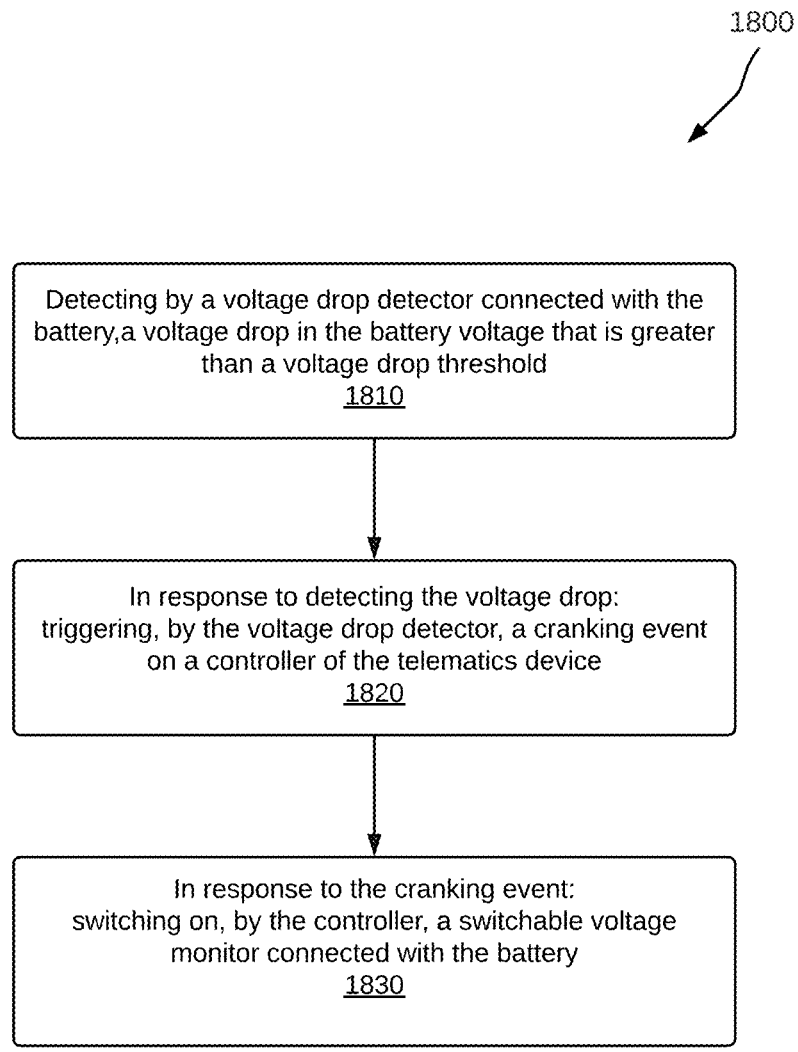
FIG. 18 is a flow chart depicting a method of detecting a cranking event and enabling a voltage monitor in response to the detecting, in accordance with embodiments of the present disclosure.

FIG. 18 depicts a method 1800 by a telematics device, in accordance with embodiments of the present disclosure. The telematics device 200 is coupled to a machine having an engine coupled to a starter powered by a battery of the machine.

At step 1810, a voltage drop detector connected with the battery detects a voltage drop in the battery voltage, the voltage drop being greater than a voltage drop threshold.

At step 1820, in response to detecting the voltage drop, the voltage drop detector triggers a cranking event on a controller of the telematics device.

At step 1830, in response to the cranking event, the controller switches on a switchable voltage monitor connected with the battery.

While the telematics device 200 has been given in the context of use in vehicles, this is not necessarily the case. For example, the telematics device 200 may be used to capture the cranking voltage in any machine having an engine that is started by a battery-powered starter motor.

Embodiments have been described where the techniques are implemented in circuitry and/or computer-executable instructions. It should be appreciated that some embodiments may be in the form of a method or process, of which at least one example has been provided. The acts performed as part of the method or process may be ordered in any suitable way. Accordingly, embodiments may be constructed in which acts are performed in an order different than illustrated, which may include performing some acts simultaneously, even though shown as sequential acts in illustrative embodiments. Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The invention claimed is:

1. A method in a telematics device coupled to a machine having an engine coupled to a starter powered by a battery of the machine, the method comprising:
   detecting, by a voltage drop detector connected with the battery, a voltage drop in a battery voltage of the battery that is greater than a voltage drop threshold;
   in response to detecting the voltage drop:
      triggering, by the voltage drop detector, a cranking event on a controller of the telematics device; and in response to the cranking event:
switching on, by the controller, a switchable voltage monitor connected with the battery.

2. The method of claim 1, further comprising converting a voltage monitor output by the switchable voltage monitor to a digital value representing a cranking voltage of the machine.

3. The method of claim 1, wherein the voltage drop detector consumes no power except when the voltage drop in the battery voltage is greater than the voltage drop threshold.

4. The method of claim 1, wherein the switchable voltage monitor consumes no power when switched off.

5. The method of claim 1, wherein the voltage drop threshold is greater than or equal to a turn-on voltage of a transistor of the voltage drop detector.

6. The method of claim 1, wherein triggering the cranking event comprises asserting a cranking event signal between the voltage drop detector and the controller.

7. The method of claim 1, wherein switching on the switchable voltage monitor comprises asserting, by the controller, a voltage monitor enablement signal between the controller and the switchable voltage monitor.

8. The method of claim 7, wherein asserting the voltage monitor enablement signal causes a transistor of the switchable voltage monitor to switch on thus connecting a voltage monitor of the switchable voltage monitor with the battery.

9. The method of claim 2, further comprising transmitting the digital value representing the cranking voltage to a remote server.

10. The method of claim 2, wherein converting the voltage monitor output by the switchable voltage monitor to the digital value comprises enabling, by the controller, a conversion at an analog-to-digital converter (ADC) coupled with the controller and connected with the voltage monitor output of the switchable voltage monitor.

11. The method of claim 1, further comprising switching off the switchable voltage monitor in response to detecting that the machine has been turned off.

12. The method of claim 11, wherein switching off the switchable voltage monitor comprises de-asserting a voltage monitor enablement signal.

13. The method of claim 12, wherein de-asserting the voltage monitor enablement signal causes a transistor of the switchable voltage monitor to turn off thus isolating a voltage monitor of the switchable voltage monitor from the battery.

14. The method of claim 6, further comprising detecting, by the voltage drop detector, a rise in the battery voltage and cancelling, by the voltage drop detector, the cranking event.

15. The method of claim 14, wherein cancelling the cranking event comprises de-asserting the cranking event signal.

16. The method of claim 1, further comprising detecting that the engine is running, and keeping the switchable voltage monitor switched on in response to detecting that the engine is running.

17. The method of claim 1, further comprising detecting that the engine is not running, and switching off the switchable voltage monitor in response to detecting that the engine is not running.

18. The method of claim 2, further comprising switching off the switchable voltage monitor subsequent to converting the voltage monitor output.

19. The method of claim 18, further comprising periodically switching on and switching off the switchable voltage monitor for obtaining a plurality of voltage monitor outputs.

20. A telematics device for coupling to a machine having an engine coupled to a starter powered by a battery of the machine, the telematics device comprising:
a controller;
a network interface coupled to the controller;
a voltage drop detector coupled to the controller and connectable with the battery;
a switchable voltage monitor coupled to the controller, and connectable with the battery;
a memory coupled to the controller, the memory storing machine-executable programming instructions for execution by the controller;
wherein when the telematics device is coupled with a vehicle:
the voltage drop detector is connected with the battery;
the switchable voltage monitor is connected with the battery;
the voltage drop detector detects a voltage drop in a battery voltage of the battery that is greater than a voltage drop threshold; and
in response to detecting the voltage drop:
the voltage drop detector triggers a cranking event on the controller; and
in response to the cranking event:
the controller executes machine-executable programming instructions which switch on the switchable voltage monitor.

* * * * *